(12) United States Patent
Lin

(10) Patent No.: US 11,133,230 B2
(45) Date of Patent: Sep. 28, 2021

(54) SEMICONDUCTOR DEVICE WITH DUAL ISOLATION LINER AND METHOD OF FORMING THE SAME

(71) Applicant: Taiwan Semiconductor Manufacturing Co., Ltd., Hsin-Chu (TW)

(72) Inventor: Yu-Kuan Lin, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/801,576

(22) Filed: Feb. 26, 2020

(65) Prior Publication Data

US 2021/0265224 A1    Aug. 26, 2021

(51) Int. Cl.
*H01L 21/8238* (2006.01)
*H01L 27/092* (2006.01)
*H01L 21/762* (2006.01)

(52) U.S. Cl.
CPC ........... *H01L 21/823878* (2013.01); *H01L 21/76229* (2013.01); *H01L 21/823807* (2013.01); *H01L 21/823821* (2013.01); *H01L 27/0924* (2013.01)

(58) Field of Classification Search
CPC ..... H01L 21/823878; H01L 21/823807; H01L 27/0924; H01L 21/76229; H01L 21/823821
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2017/0103985 A1* | 4/2017 | Kim | ............... H01L 21/823821 |
| 2018/0090504 A1* | 3/2018 | Balakrishnan | ............................... H01L 21/823487 |

* cited by examiner

*Primary Examiner* — Karen Kusumakar
*Assistant Examiner* — Adam S Bowen
(74) *Attorney, Agent, or Firm* — Haynes and Boone, LLP

(57) ABSTRACT

Semiconductor device and the manufacturing method thereof are disclosed herein. An exemplary semiconductor device comprises a substrate having a first region and a second region; a first semiconductor fin formed on the substrate within the first region; a second semiconductor fin formed on the substrate within the second region; a first liner layer disposed along a lower portion of the first semiconductor fin and a lower portion of the second semiconductor fin; a second liner layer disposed over the first liner layer in the second region, wherein the second liner layer is different from the first liner layer in composition; and an isolation feature disposed on the first liner layer in the first region and on the second liner layer in the second region, and separating lower portions of the first semiconductor fin and the second semiconductor fin.

20 Claims, 25 Drawing Sheets

US 11,133,230 B2

SEMICONDUCTOR DEVICE WITH DUAL ISOLATION LINER AND METHOD OF FORMING THE SAME

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. For example, it has been observed that the semiconductor fins of the FinFET are formed protruding from the substrate with a thin and high shape and the surface of the semiconductor fins may include some defects and may affect the reliability of the isolation feature (for example, a shallow trench isolation (STI) feature). Therefore, the performance of the FinFET may be degraded. Accordingly, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
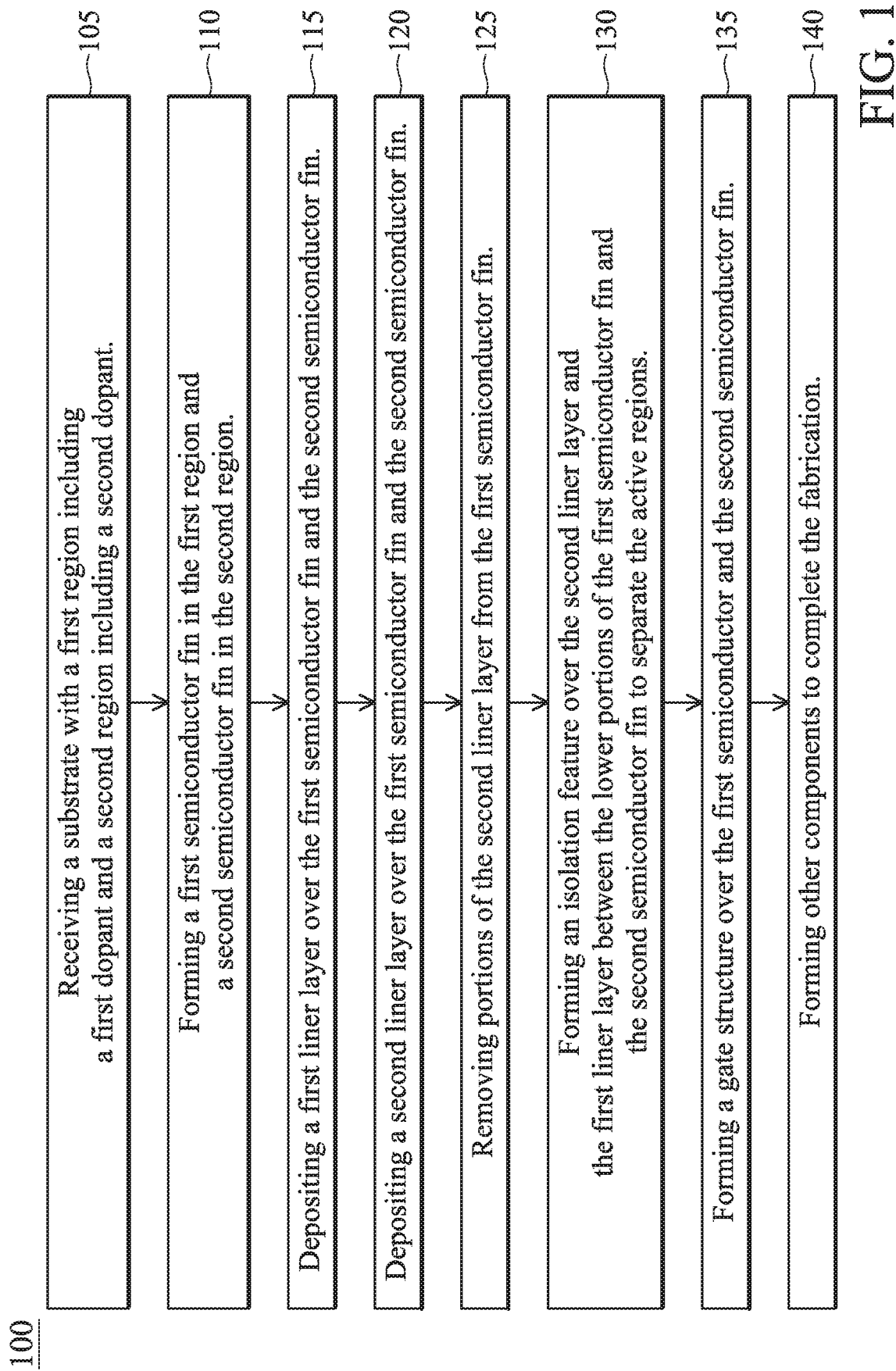
FIG. 1 illustrates a flowchart of an example method for making an example semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating fin-like field-effect transistors (FinFETs) or other three-dimensional semiconductor devices.

One such three-dimensional semiconductor device that has been introduced is the FinFET. The FinFET gets its name from the fin-like structure which extends from a substrate, and which is used to form the field-effect transistor (FET) channel. Another example of the three-dimensional semiconductor device is called a gate-all-around (GAA) device, whose channel structure includes multiple semiconductor channel layers, and the gate structure extends around the channel layers and provides access to the channel region on all sides. Due to the limitation of fabrication techniques, the surfaces of the thin and high semiconductor fin structures of the FinFETs or GAA transistors used to have some defects, which may affect the reliability of the isolation feature (for example, a STI feature) to isolate the active regions of the semiconductor device. An isolation liner is considered to applied around the semiconductor fins to repair/restore the surfaces thereof. For example, an isolation liner including silicon oxide (SiO2) or silicon nitride (Si3N4) may be formed over the surfaces of the semiconductor fins. However, the SiO2 isolation liner cannot block the oxygen ions in the isolation feature which may induce an oxidation issue of the channel (for example, including silicon germanium (SiGe)) of the p-type field-effect transistors (PFET); and the Si3N4 isolation liner may cause the boron dopant in the n-type field-effect transistors (NFET) deactivated.

The present disclosure provides a semiconductor device with dual isolation liner layers. For example, after the semiconductor fins are formed protruding from the substrate, a first liner layer (for example, including SiO2) is deposited on the semiconductor fins of the NFET and PFET. Thereafter, a second liner layer (for example, including Si3N4) is deposited on the first liner layer. In some embodiments, the second liner layer disposed over the semiconductor fins of the NFET (over the p-type doped region of the substrate) may be removed. Subsequently, an isolation feature is formed to isolate the active regions of the semiconductor device. Thereby, the dual liner layers can recover the surfaces of the semiconductor fins for the NFET and the PFET. The first liner layer including SiO2 can protect the p-type dopant of the NFET from being deactivated, and the second liner layer including Si3N4 can protect the channel of the PFET from being oxidized. Therefore, the performance of the semiconductor device can be improved. Of course, these advantages are merely exemplary, and no particular advantage is required for any particular embodiment.

FIG. 1 illustrates a flow chart of a method 100 for forming a semiconductor device 200 (hereafter called device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various schematic top view and cross-sectional views of device 200 during intermediate steps of method 100.

Figure 2:
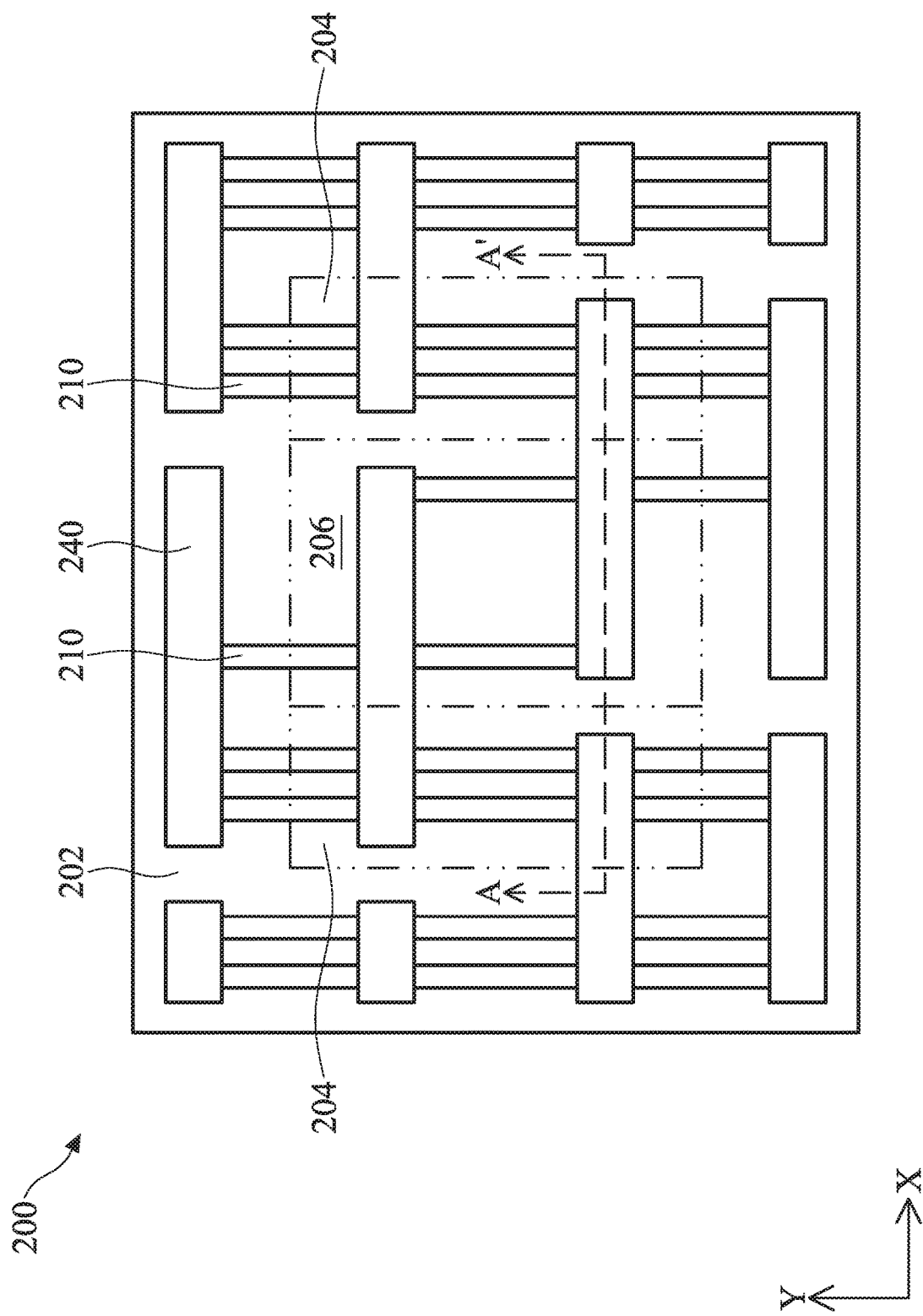
FIG. 2 illustrates a simplified schematic top view of the example semiconductor device in accordance with some embodiments of the present disclosure.

FIG. 2 illustrates a simplified schematic top view (for example, in an x-y plane) of the device 200 in accordance with some embodiments of the present disclosure; and FIGS. 3-18 illustrate cross-sectional views of block B of device 200 taken along line A-A' in FIG. 1 (that is, in an x-z plane). Device 200 generally refers to any fin-based device, which can be included in a microprocessor, a memory cell, and/or other IC device. In some implementations, device 200 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 2-18 have been simplified for the sake of clarity to better understand the inventive concepts of the present disclosure. Additional features can be added in device 200, and some of the features described below can be replaced, modified, or eliminated in other embodiments of device 200.

Figure 3:
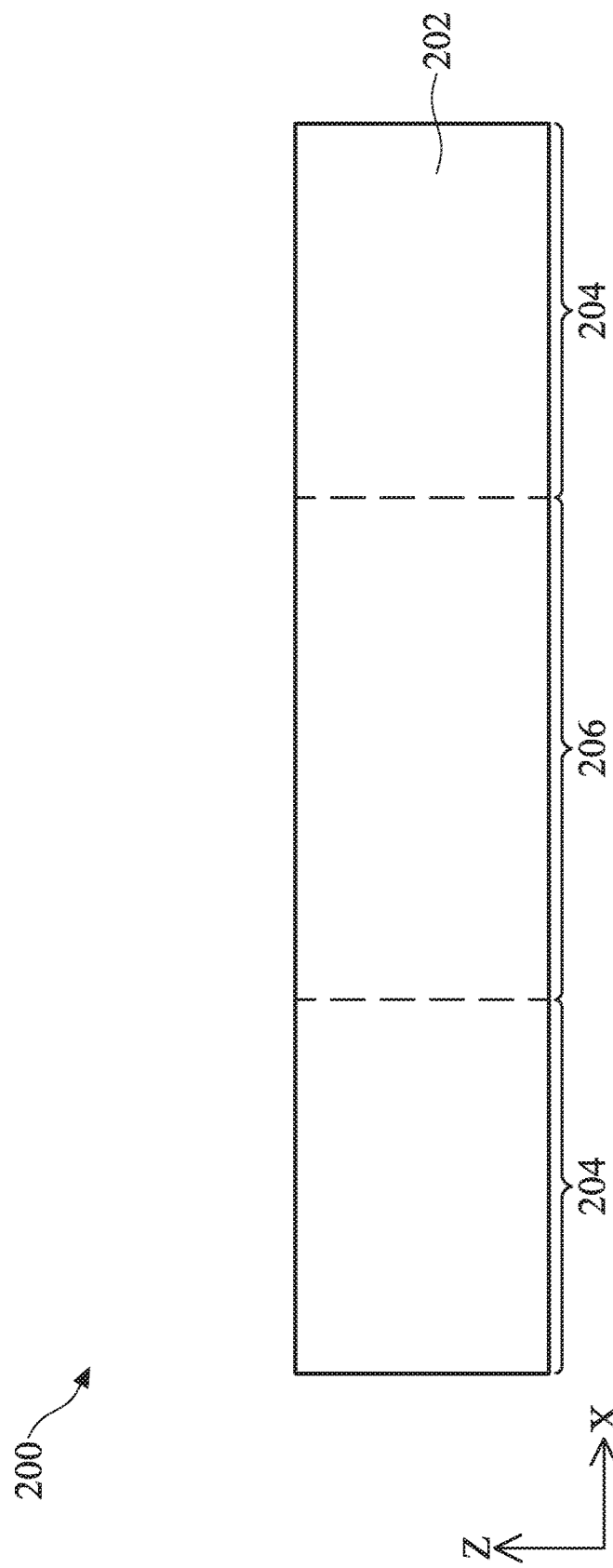
FIGS. 3-18 illustrate cross-sectional views of block B of the example semiconductor device along line A-A' in FIG. 2 at intermediate stages of the example method of FIG. 1 in accordance with some embodiments of the present disclosure.

According to FIGS. 1-3, at operation 105, a substrate 202 is received. In the depicted embodiment, the substrate 202 is a bulk substrate that includes silicon. Alternatively or additionally, the substrate 202 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, GaAsP, AlInAs, AlGaAs, GaInAs, GaInP, and/or GaInAsP; or combinations thereof. Alternatively, the substrate 202 is a semiconductor-on-insulator substrate, such as a silicon-on-insulator (all) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, the substrate 202 includes one or more group III-V materials. In some implementations, the substrate 202 includes one or more group II-IV materials.

Referring to FIG. 3, the substrate 202 is doped with different dopants to form various doped regions therein. In some implementations, the substrate 202 includes p-type doped regions 204 (for example, p-type wells) doped with p-type dopants, such as boron (for example, $BF_2$), indium, other p-type dopant, or combinations thereof. The substrate 202 also includes n-type doped regions 206 (for example, n-type wells) doped with n-type dopants, such as phosphorus, arsenic, other n-type dopant, or combinations thereof. The various doped regions can be formed directly on and/or in substrate 202. An ion implantation process, a diffusion process, and/or other suitable doping process can be performed to form the various doped regions. In the depicted embodiment, the p-type doped region 204 (also referred to as a p-well) is configured for an n-type filed effect transistor (NFET), thus the p-type doped region 204 is also referred to as an NFET region 204, the n-type doped region 206 (also referred to as an n-well) is configured for a p-type filed effect transistor (PFET), thus the n-type doped region 206 is also referred to as a PFET region 206. In some implementations, the PFET region (n-type doped region) 206 includes n-type dopants (such as phosphorus, hereinafter represented by [P]) of a concentration about $1 \times 10^{13}$ cm$^{-3}$ to about $1 \times 10^{14}$ cm$^{-3}$, and the NFET region (p-type doped region) 204 includes p-type dopants (such as boron, hereinafter represented by [B]) of a concentration about $1 \times 10^{13}$ cm$^{-3}$ to about $1 \times 10^{14}$ cm$^{-3}$.

In some embodiments, the concentration of the n-type dopant is substantially equal to the concentration of the p-type dopant. Here the term "substantially equal" indicate a difference of equal or less than 20%. In the depicted embodiment, the n-type and/or the p-type doped regions are formed before the fabrication of the semiconductor fins. In some other embodiments, the n-type and/or the p-type doped regions are formed after the fabrication of the semiconductor fins and/or the isolation feature, which will be discussed below.

Figure 4:
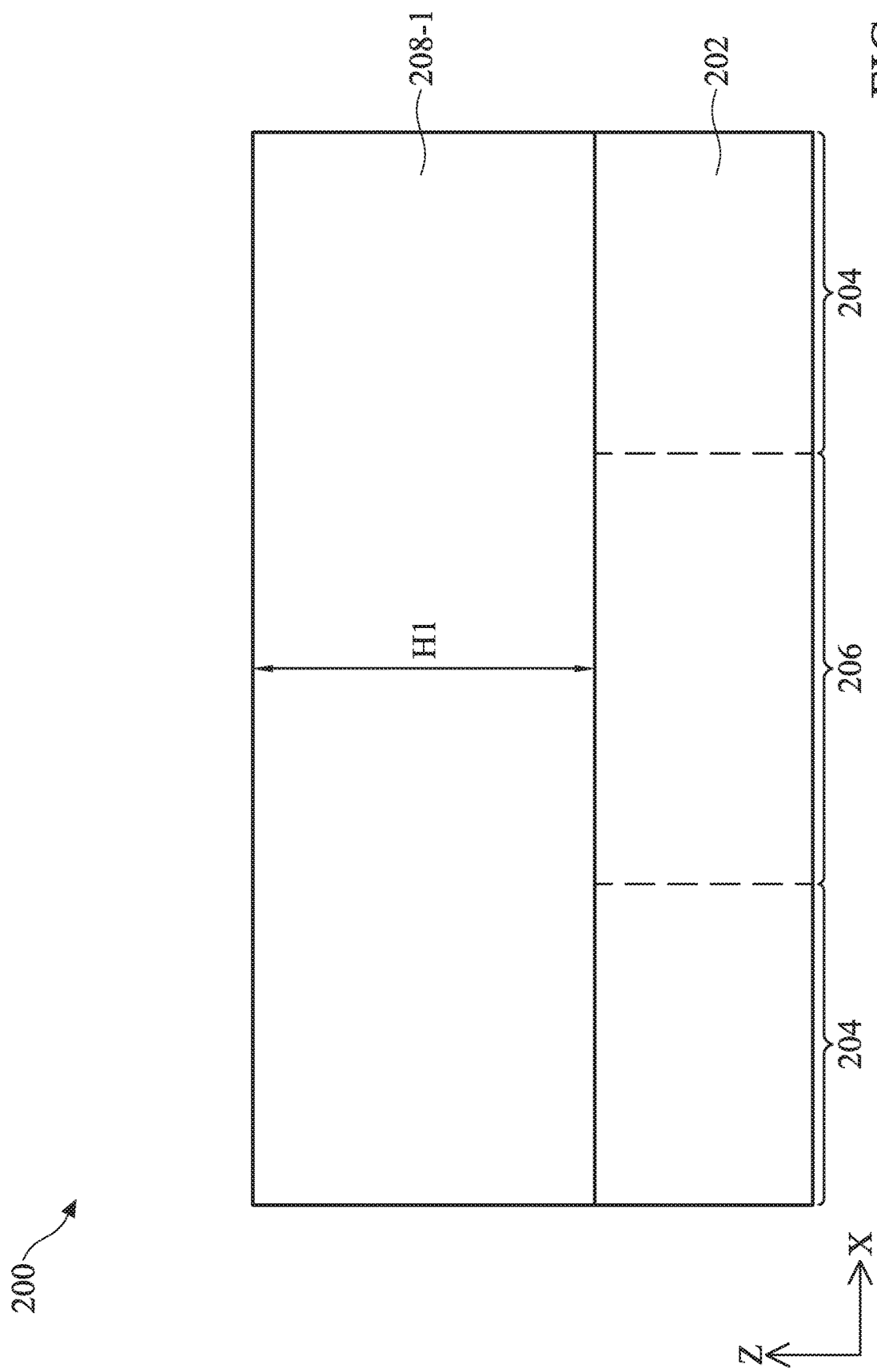

Referring to FIGS. 1 and 4-8, at operation 110, semiconductor fins 210-1 and 210-2 (all referred to as semiconductor fins 210) are formed protruding from the substrate 202 in the NFET region 204 and the PFET region 206, respectively. Formation of the semiconductor fins 210 involves various steps, such as epitaxy process, deposition, lithography, etching, etc. Referring to FIG. 4, first, a first semiconductor material layer 208-1 is disposed over the substrate 202. In some embodiments, the first semiconductor material layer 208-1 includes silicon germanium (SiGe) which is used to form the p-type semiconductor fins 210-2 (see, FIG. 8) in the PFET region 206. In some embodiments, the first semiconductor material layer 208-1 is epitaxially grown on the substrate 202. An epitaxy process can implement chemical vapor deposition (CVD) techniques (for example, vapor-phase epitaxy (VPE), ultra-high vacuum CVD (UHV-CVD), low pressure CVD (LPCVD), and/or plasma-enhanced CVD (PECVD)), molecular beam epitaxy (MBE), other suitable selective epitaxy growth (SEG) processes, or combinations thereof. The epitaxy process can use gaseous and/or liquid precursors, which interact with the composition of the substrate 202. As depicted in FIG. 4, the first semiconductor material layer 208-1 may be grown to a height H1. In some embodiments, the height H1 is about 40 nm to about 70 nm.

Figure 5:
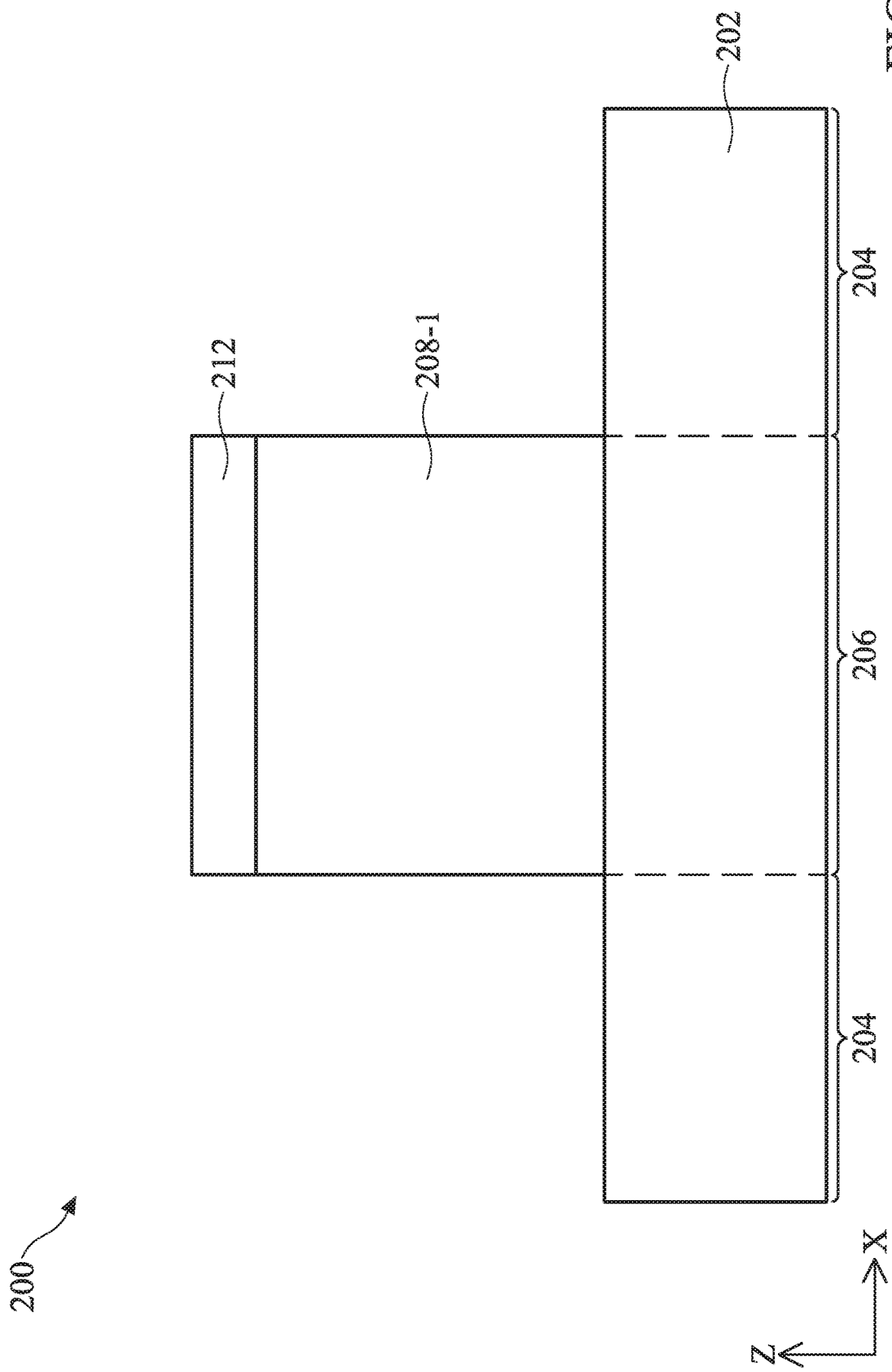

Referring to FIG. 5, still at operation 110, a lithography process is performed to remove the first semiconductor material layer 208-1 from the p-type doped regions 204. The lithography process includes forming a resist layer 212 over the first semiconductor material layer 208-1; performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer 212 that corresponds with the mask pattern. Since the resist layer 212 is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer 212 includes a resist pattern that corresponds with the mask. The etching process uses the patterned resist layer 212 as an etch mask to remove the portions of the first semiconductor material layer 208-1 over the p-type doped regions 204. The etching process can include a dry etching process (for example, a reactive ion etching (RIE) process), a wet etching process, other suitable etching process, or combinations thereof. After the etching process, the patterned resist layer is removed from the first semiconductor material layer 208-1, for example, by a resist stripping process.

Figure 6:
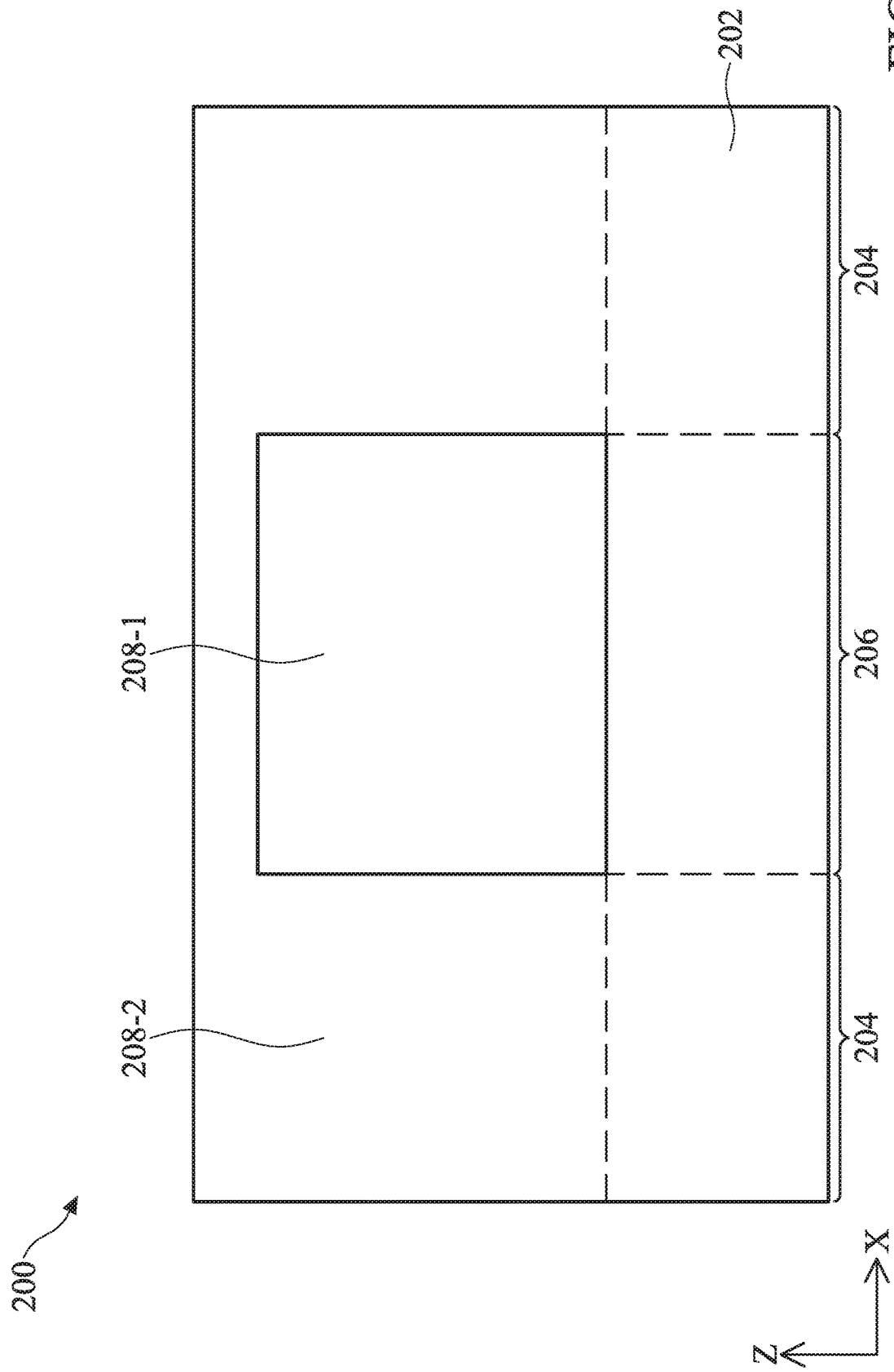

Referring to FIG. 6, still at operation 110, a second semiconductor material layer 208-2 is formed over the substrate 202 and the first semiconductor material layer 208-1. In some embodiments, the second semiconductor material layer 208-2 includes silicon (Si) which is the same as the material of the substrate 202 and is used to form the n-type semiconductor fins 210-1 (see, FIG. 8) in the NFET region 204. In some embodiments, the second semiconductor material layer 208-2 is epitaxially grown on the substrate 202 and the first semiconductor material layer 208-1. An epitaxy process can implement CVD deposition techniques (for example, VPE, UHV-CVD, LPCVD, and/or PECVD), MBE, other suitable SEG processes, or combinations thereof. The epitaxy process can use gaseous and/or liquid precursors, which interact with the composition of the substrate 202.

Figure 7:
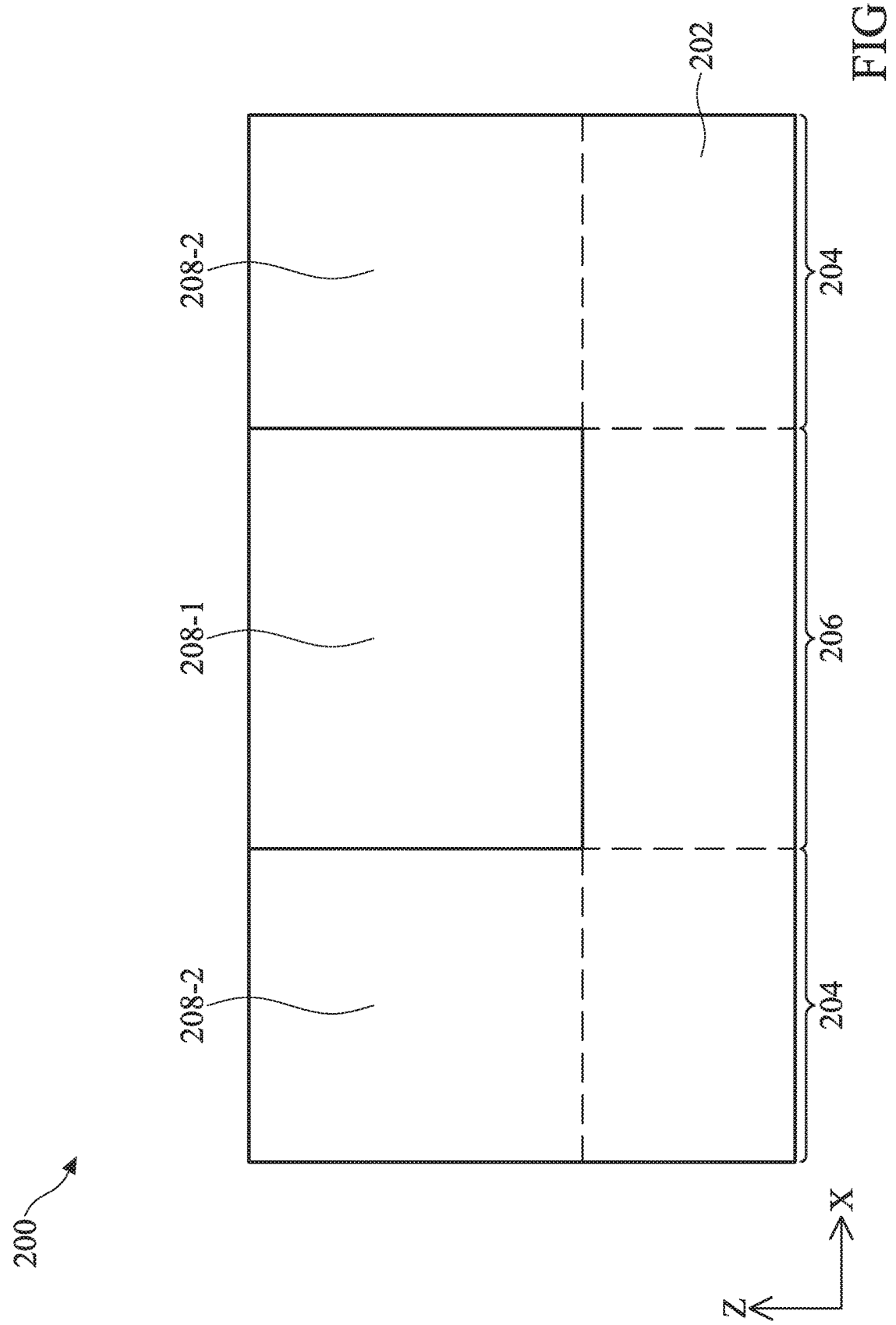

Referring to FIG. 7, a planarization process is applied to the top portion of the device 200. The planarization process may include a chemical mechanical polishing (CMP) process to remove excess material of the second semiconductor material layer 208-2, thereby to expose the first semiconductor layer 208-1 from the top surface of the device 200. As depicted in FIG. 7, the second semiconductor material layers 208-2 are formed over the NFET region 204 and the first semiconductor material layer 208-1 is formed over the PFET region 206. In some embodiment, the first semiconductor material layer 208-1 and the second semiconductor material layer 208-2 may include the dopant that is the same as those in the corresponding doped region over which they are formed. For example, in the depicted embodiment, the first semiconductor material layer 208-1 includes SiGe to form a p-type semiconductor fin over the PFET region 206, the n-type dopant (for example, [P]) of the PFET region 206 may move up and diffuse into the first semiconductor material layer 208-1; the second semiconductor material layer 208-2 includes Si to form an n-type semiconductor fin over the NFET region 204, the p-type dopant (for example, [B]) of the NFET region 204 may move up and diffuse into the second semiconductor material layer 208-2. In some embodiments, a dopant concentration in the first semiconductor material layer 208-1 is less than a dopant concentration in the PFET region 206; and a dopant concentration in the second semiconductor material layer 208-2 is less than a dopant concentration in the NFET region 204. In some other embodiments, an extra doping process may be performed to the first semiconductor material layer 208-1 and/or the second semiconductor material layer 208-2 to achieve a designed dopant concentration of the semiconductor fins 210. The dopant concentration in the first semiconductor material layer 2018-1 and in the second semiconductor material layer 208-2 may be substantially equal to or greater than the dopant concentration of the doped regions 206 and 204, respectively. An ion implantation process, a diffusion process, and/or other suitable doping process can be performed to the first semiconductor material layer 208-1 and/or the second semiconductor material layer 208-2.

Figure 8:
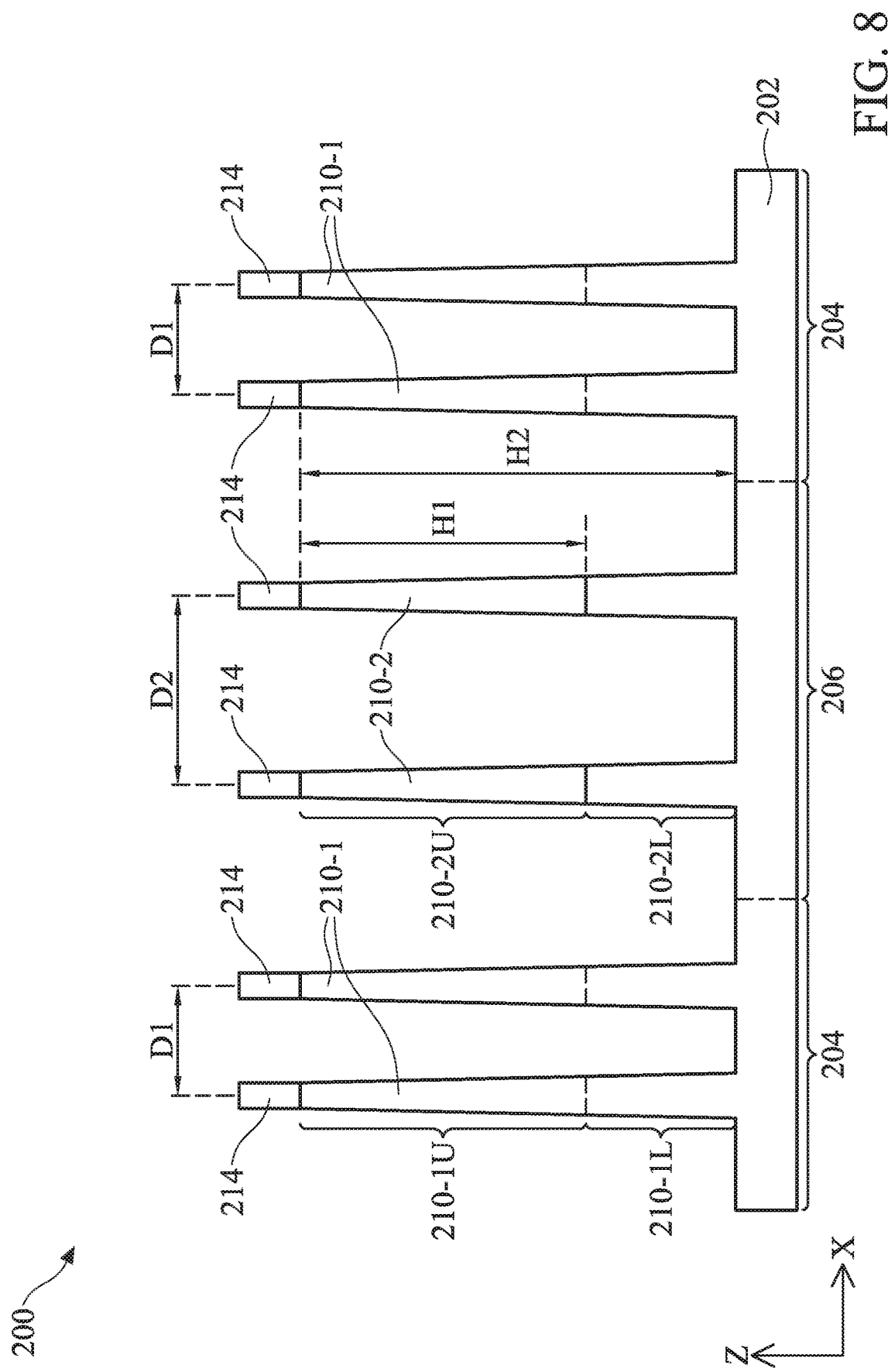

Referring to FIG. 8, a combination of lithography and/or etching processes are performed to define semiconductor fins 210-1 and 210-2 extending from the substrate 202 (as illustrated in FIG. 2). The lithography process is similar as that is discussed above regarding FIG. 5. First, a patterned hard mask 214 is formed over the semiconductor material layers 208-1 and 208-2. The etching process uses the patterned hard mask 214 as an etch mask to remove portions of the semiconductor material layers 208-1 and 208-2 to define the semiconductor fins 210-1 and 210-2. In the depicted embodiment, the remained portions of the semiconductor material layers 208-1 form upper portions 210-2U of the semiconductor fins 210-2; and the remained portions of the semiconductor material layers 208-2 form upper portions 210-1U of the semiconductor fins 210-1. In the depicted embodiments, the substrate 202 is also etched to form the lower portions 210-1L and 210-2L of the semiconductor fins 210-1 and 210-2, respectively. The etching process can include a dry etching process (for example, a reactive ion etching (RIE) process), a wet etching process, other suitable etching process, or combinations thereof. After the etching process, the patterned hard mask 214 is removed from the semiconductor fins 210-1 and 210-2, for example, by a resist stripping process.

Alternatively, semiconductor fins 210-1 and 210-2 are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming semiconductor fins 210-1 and 210-2. Further, in some implementations, the exposure process can implement maskless lithography, extreme ultraviolet lithography (EUV), electron-beam (e-beam) writing, ion-beam writing, and/or nanoimprint technology for patterning the resist layer and/or other layers.

As depicted in FIG. 8, each of the n-type semiconductor fins 210-1 includes an upper portion 210-1U and a lower portion 210-1L, and each of the p-type semiconductor fins 210-2 includes an upper portion 210-2U and a lower portion 210-2L. In some embodiments, a p-type dopant (for example, [B]) concentration of the upper portions 210-1U of the semiconductor fins 210-1 is less than the p-type dopant (for example, [B]) concentration of the lower portions 210-1L of the semiconductor fins 210-1; and an n-type dopant (for example, [P]) concentration of the upper portions 210-2U of the semiconductor fins 210-2 is less than an n-type dopant (for example, [P]) concentration of the lower portions 210-2L of the semiconductor fins 210-2. In some other embodiments, the dopant concentration of the upper portions of the semiconductor fins is substantially equal to or greater than the dopant concentration of the lower portions of the semiconductor fins.

The semiconductor fins 210 (including semiconductor fins 210-1 and 210-2) are oriented substantially parallel to one another, each having a width defined in the x-direction, a length defined in the y-direction, and a height defined in the z-direction. The present disclosure contemplates variations in height, width, and length of the semiconductor fins 210 that may arise from the processing and fabrication. For example, in FIG. 8, a width of the semiconductor fins 210 varies from the top surfaces of the semiconductor fins 210 to the bottom surfaces of the semiconductor fins 210. In some embodiments, the widths are not tapered, such that at least one of the semiconductor fins 210 have substantially the same width along their height. In some embodiments, a height H1 of the upper portions 210-1U and 210-2U is about 40 nm to about 70 nm. In some embodiments, a height H2 of the semiconductor fins 210-1 and 210-2 (measuring from the top surface of the recessed substrate 202) is about 90 nm to about 150 nm. In some embodiments, a pitch distance between the adjacent semiconductor fins 210-1 of the n-type transistors is less than a pitch distance between the adjacent semiconductor fins 210-2 of the p-type transistors. For example, as depicted in FIG. 8, the pitch distance D1 between the adjacent semiconductor fins 210-1 of the NFET is about 20 nm to about 35 nm, and the pitch distance D2 between the adjacent semiconductor fins 210-2 of PFET is about 25 nm to about 50 nm.

Semiconductor fins 210 each have at least one channel region, at least one source region, and at least one drain region defined along their length in the y-direction, where a channel region is disposed between a source region and a drain region (generally referred to as source/drain regions). In the depicted embodiment, the upper portions 210-1U of the semiconductor fins 210-1 including Si and doped with [B] form the channel regions of the NFET, the upper portions 210-2U of the semiconductor fins 210-2 including SiGe and doped with [P] form the channel regions of the p-type transistors. The channel regions will be engaged with gate structures (formed later), such that current can flow between the source/drain regions during operation. In the depicted embodiments, each of the upper portion (for example, 210-1U or 210-2U) of the semiconductor fins 210 include one semiconductor layer. In some other embodiments, the upper portions of the semiconductor fins 210 can include a semiconductor layer stack having various semiconductor layers (such as a heterostructure) disposed over the lower portions. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of the device 200. In some embodiments, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b$/$Si_cGe_d$/$Si_aGe_b$/$Si_cGe_d$/$Si_aGe_b$/$Si_cGe_d$ from bottom to top, where a, c are different atomic percentages of silicon and b, d are different atomic percentages of germanium).

Figure 9:
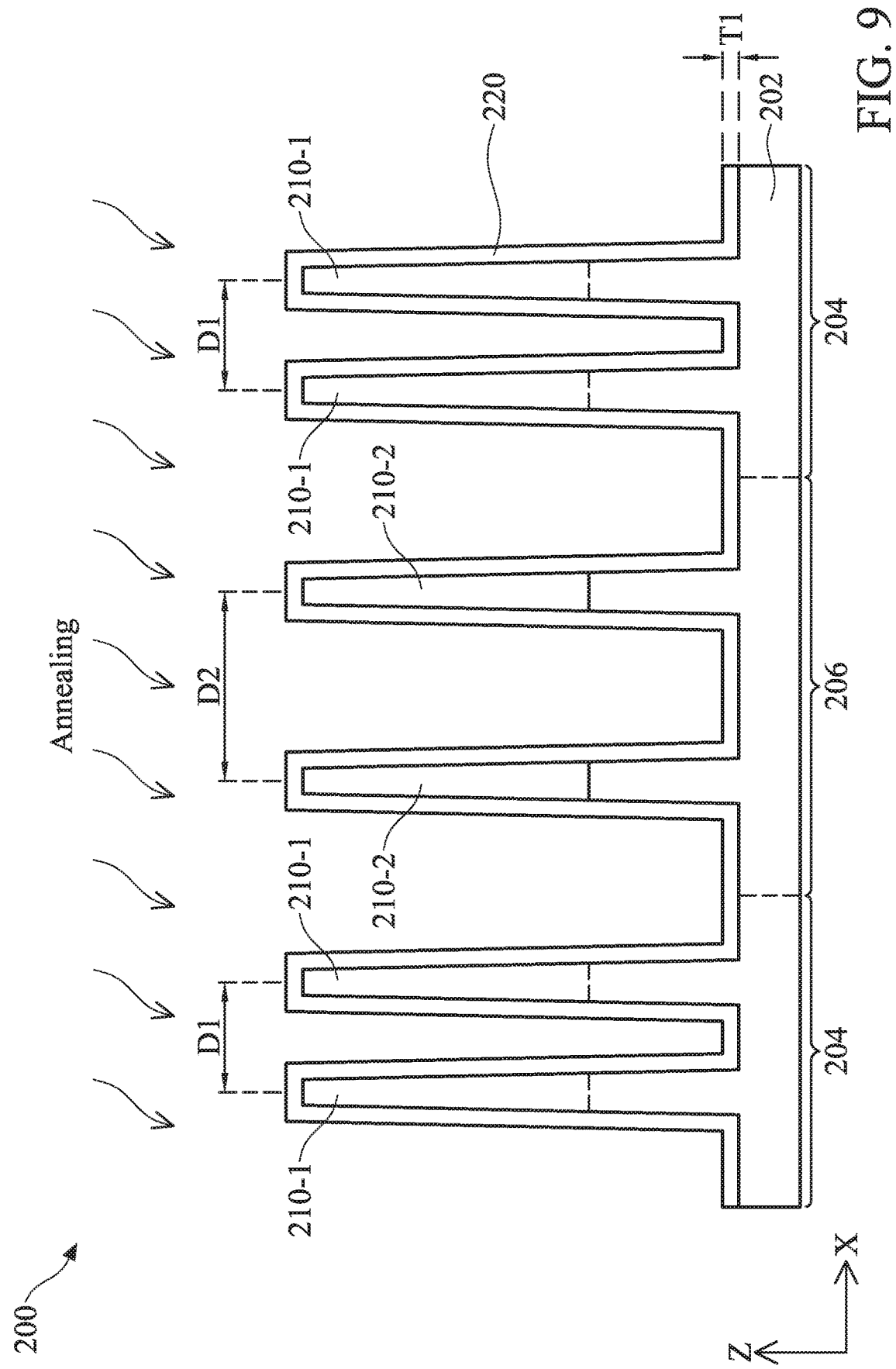

Now referring to FIGS. 1 and 9, at operation 115, a first liner layer 220 is deposited over the semiconductor fins 210 (including the semiconductor fins 210-1 and 210-2). In some embodiments, the first liner layer 220 is a dielectric layer including an oxygen-containing dielectric material. For example, the first liner layer 220 includes silicon dioxide (SiO2). Due to the small pitch distance D1 (for example, about 20 nm to about 35 nm) between the semiconductor fins 210-1 and the small pitch distance D2 (for example, about 25 nm to about 50 nm) between the semiconductor fins 210-2, a thickness T1 of the first liner layer 220 is constrained. In some embodiments, the first liner layer 220 is conformally deposited over the semiconductor fins 210-1 and 210-2, as well as the substrate 202, that is, having about the same thickness on top surfaces and along sidewalls of the semiconductor fins 210 and he on top surface of the substrate 202. For example, the first liner layer 220 is deposited by atomic layer deposition (ALD), such that the first liner layer 220 has about the same thickness T1 over the top surfaces of the semiconductor fins 210-1 and 210-2, extending along the sidewalls of the semiconductor fins 210-1 and 210-2, and over the top surface of the substrate 202. In some embodiments, the thickness T1 is about 2 nm to about 4 nm, such that it is thick enough to protect the p-type dopant (such as [B]) in the semiconductor fins 210-1 from being deactivated by electric charges and is thin enough to ensure enough space for the second liner layer and an isolation feature to be formed between the adjacent semiconductor fins 210-1 and 210-2.

In some embodiments, after the deposition of the first liner layer 220, an annealing process may be performed to enhance the first liner layer 220. For example, the device 200 is heated to a temperature of about 900° C. to about 1100° C. with an oxygen-free gas (for example, nitrogen ($N_2$)), such that the silicon atoms of the first liner layer 220 may be arranged in a better way, and the first liner layer 220 may have a better bonding with the semiconductor fins 210.

Figure 10:
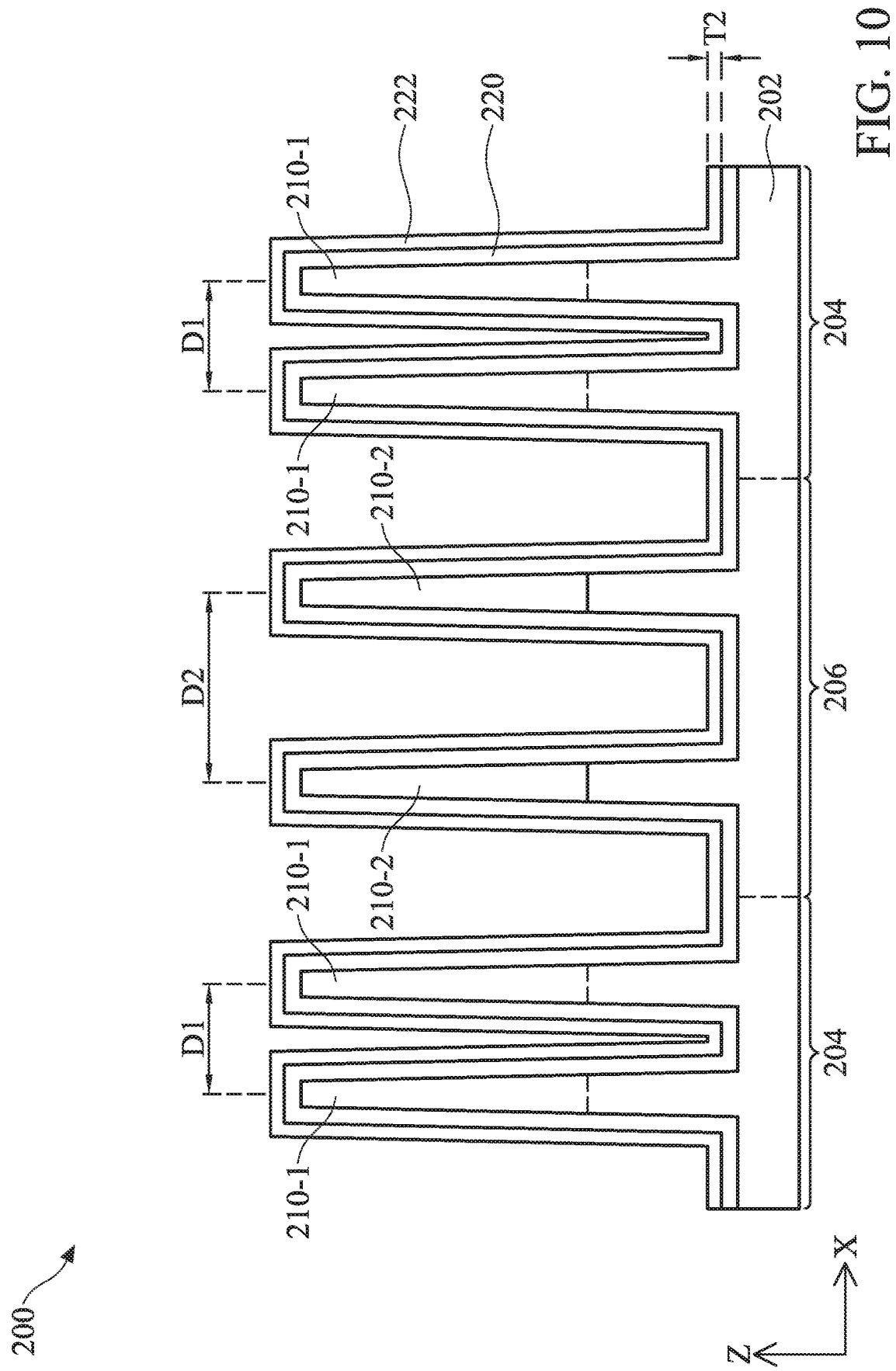

Now referring to FIGS. 1 and 10, at operation 120, a second liner layer 222 is deposited over the first liner layer 220. In some embodiments, the second liner layer 222 is a dielectric layer including a nitrogen-containing dielectric material which is denser than the first liner layer 220. For example, the second liner layer 222 includes silicon nitride (Si3N4), silicon carbonitride (SiCN), and/or silicon oxynitride (SiON). In some embodiments, the second liner layer 222 may include n-type dopant (for example [P]) or p-type dopant (for example [B]). Due to the small pitch distance D1 (for example, about 20 nm to about 35 nm) between the semiconductor fins 210-1 and the small pitch distance D2 (for example, about 25 nm to about 50 nm) between the semiconductor fins 210-2, a thickness T2 of the second liner layer 222 is constrained. In some embodiments, the second liner layer 222 is conformally deposited over the first liner layer 220, that is, having about the same thickness on top surfaces and bottom surfaces and along sidewalls of the first liner layer 220. For example, the second liner layer 222 is deposited by ALD, such that the second liner layer 220 has about the same thickness T2 over the top surfaces and bottom surfaces of the first liner layer 220, extending along the sidewalls of the first liner layer 220. In some embodiments, the thickness T2 is about 1 nm to about 3 nm, such that it is thick enough to protect the channel region of the PFET (for example, the upper portion 210-2U of the semiconductor fins 210-2) from being oxidized by the later formed isolation feature and is thin enough to ensure enough space for the isolation feature to be formed between the adjacent semiconductor fins 210-1 and 210-2.

Figure 11:
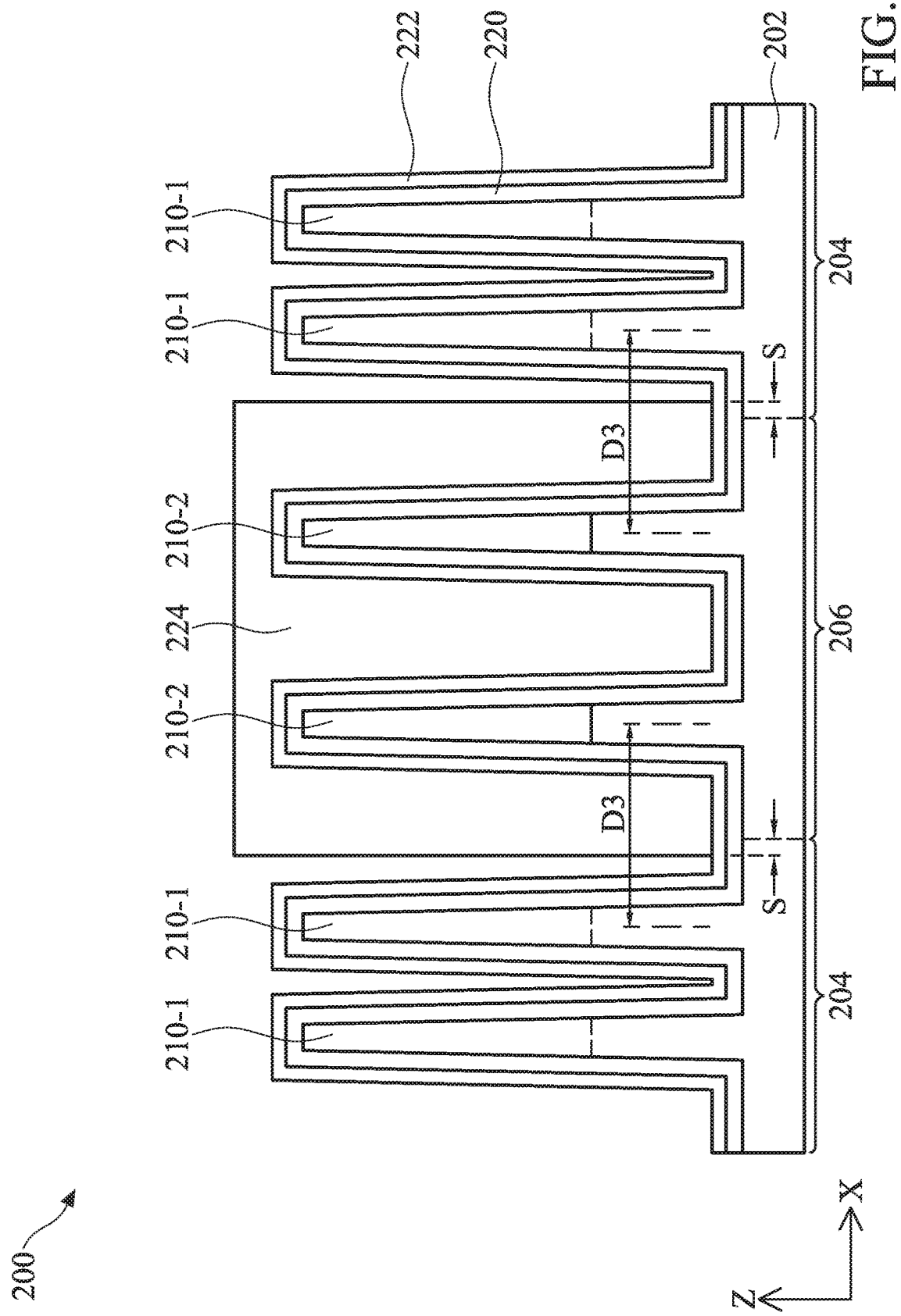
Figure 12:
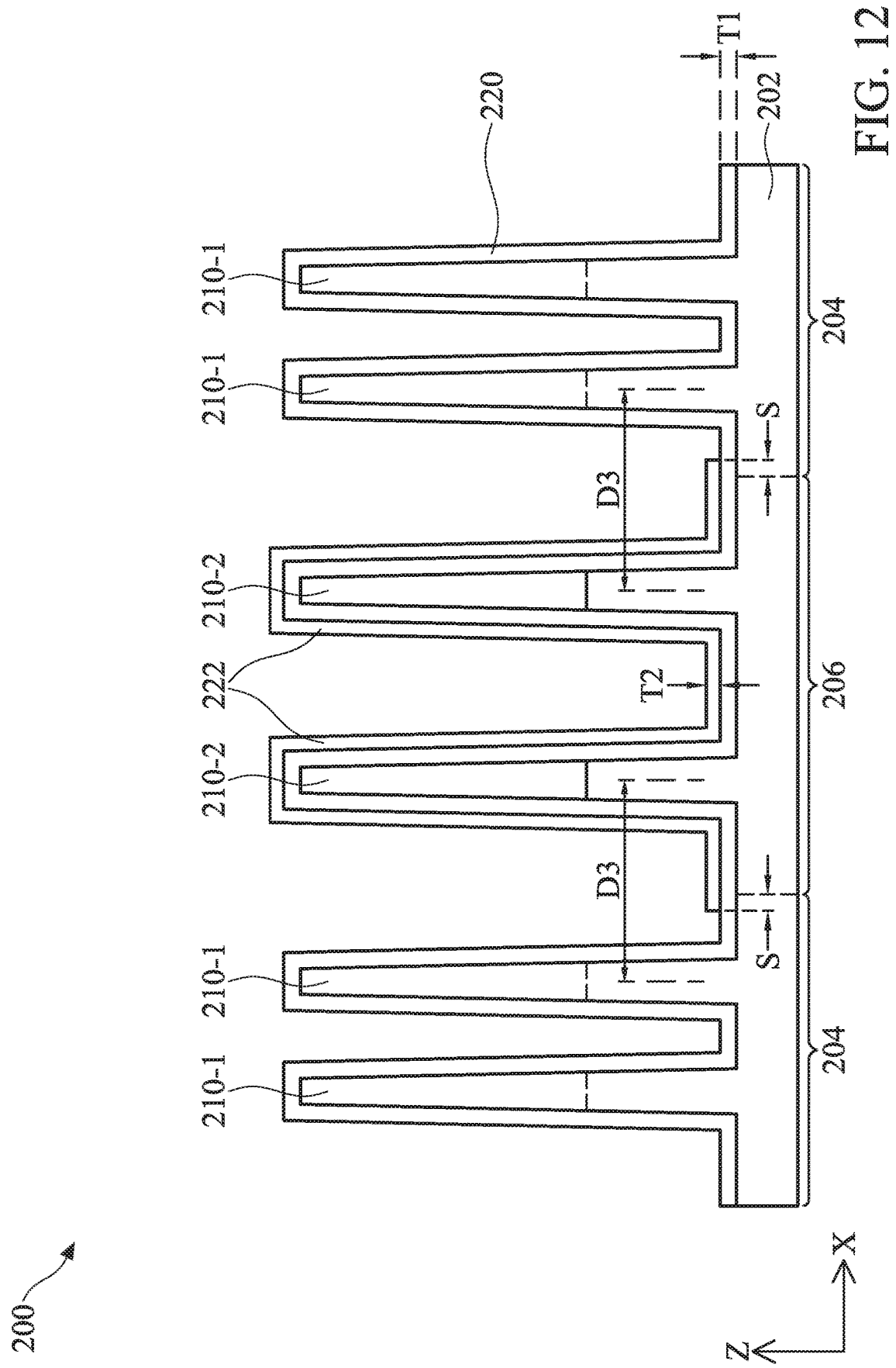

Now referring to FIGS. 1, 11 and 12, at operation 125, portions of the second liner layer 222 formed on the first liner layer 220 and over the semiconductor fins 210-1 are removed. In other words, portions of the second liner layer 222 formed in the NFET region 204 are removed such that the first liner layer 220 are exposed in the NFET region 204. In some embodiments, removing of the second liner layer 222 in the NFET regions 204 involves various steps. For example, referring to FIG. 11, a patterned hard mask 224 is formed over the PFET region 206. The hard mask 224 is patterned by a lithography process as described above. The hard mask 224 can protect the second liner layer 222, the first liner layer 220, and the semiconductor fins 210-2 in the PFET region 206 not being affected while removing the second liner layer 222 in the NFET region 204. In some embodiments, due to the process control ability, the patterned hard mask 224 may have a shift S in the x-direction, for example, to the left, to the right, or to both sides (as depicted in FIG. 11). In some embodiments, a shifting ratio (i.e. a ratio of the shift distance S to a distance D3 between the closest NFET fin 210-1 and PFET fin 210-2) is less than about 30%. For example, the distance D3 between the center of the closest NFET fin 210-1 and PFET fin 210-2 is about 30 nm to about 100 nm, and the shift distance S is less than about 15 nm.

Thereafter, referring to FIG. 12, a removing process is applied to the second liner layer 222 in the NFET region 204. Since the materials of the second liner layer 222 (for example, Si3N4) and the materials of the first liner layer 220 (for example, SiO2) provide different etching selectivities, portions of the second liner layer 222 in the NFET region 204 can be selectively removed. In some embodiments, the selective removing process is a selective etching process including dry etching process, wet etching process, other etching process, or combinations thereof. In some further embodiments, the selective etching process is a selective dry etching process using phosphoric acid (H3PO4). Thereafter, the hard mask 224 is removed by a suitable process. As depicted in FIG. 12, after operation 125, the semiconductor fins 210-1 of the NFET are formed within the NFET region 204 and are covered by the first liner layer 220, not the second liner layer 222; the semiconductor fins 210-2 of the PFET are formed within the PFET region 206 and are covered not only by the first liner layer 220, but also by the second liner layer 222. The first liner layer 220 and the second liner layer 222 form a liner layer structure. In other words, the liner layer structure includes the first liner layer 220 disposed over both the semiconductor fins 210-1 in the NFET region 204 and the semiconductor fins 210-2 in the PFET region 206 and the second liner layer 222 disposed over the semiconductor fins 210-2 in the PFET region 206. In some embodiments, the second liner layer 222 may shift to the NFET region 204 and cover a portion of the first liner layer 220 over the substrate 202 due to the process control ability. A shifting ratio of the second liner layer 222 is defined as a ratio of the shifting distance S to a distance D3 between the closest NFET fin 210-1 and PFET fin 210-2 (i.e. the distance between the center of the closest NFET fin 210-1 and PFET fin 210-2) In some embodiments, the shifting ratio of the second liner layer 222 is less than about 30%. For example, the distance D3 between the center of the closest NFET fin 210-1 and PFET fin 210-2 is about 30 nm to about 100 nm; and the shifting distance S is less than about 15 nm.

In a conventional semiconductor device, a liner layer structure may include only one layer, for example, a SiO2 liner layer or a Si3N4 liner layer. However, either SiO2 liner layer or Si3N4 liner layer has its issue. For example, if only the SiO2 liner layer is used, it cannot block the oxygen ions of the later formed isolation feature from diffusing into and reacting with the SiGe channels of the PFET. Thereby, the SiGe channels of the PFET are oxidized and the performance of the PFET are degraded. For another example, if only the Si3N4 liner layer is used, it can protect the SiGe channel of the PFET from being oxidized. However, the Si3N4 liner layer contains electric charges, which may cause the p-type dopant (for example, [B]) in the NFET deactivated, thereby degrade the performance of the NFET.

However, in the present disclosure, the liner layer structure includes two liner layers, a first liner layer 220 including oxygen-contained dielectric material and disposed over both the semiconductor fins for PFET and NFET, and a second liner layer 222 including nitrogen-contained dielectric material and disposed over the semiconductor fins for the PFET. Therefore, the dopant (for example, [B]) of the NFET (i.e. p-well) is protected by the first oxygen-contained liner layer 220 and is prevented from being deactivated by the electric charges of the second liner layer 222, such that the NFET channel can be more uniform and the better p-well dopant stability can mitigate the CMOS latch-up (short circuit) issue. The second liner layer 222 can block the oxygen ions of the isolation feature from reacting with the SiGe channel of the PFET to mitigate the oxidation issue of the SiGe channel of the PFET. Therefore, the PFET mobility can be improved. Thereby, the performance of the NFET and the PFET of the semiconductor device can be improved. For an SRAM, the dual liner structure can improve the stability of the threshold voltage and the leakage current of the pull-down transistors (i.e. NFET) and the mobility of the pull-up transistors (i.e. PFET). Therefore, the SRAM can operate at a lower voltage and consume less power during operation.

Figure 13:
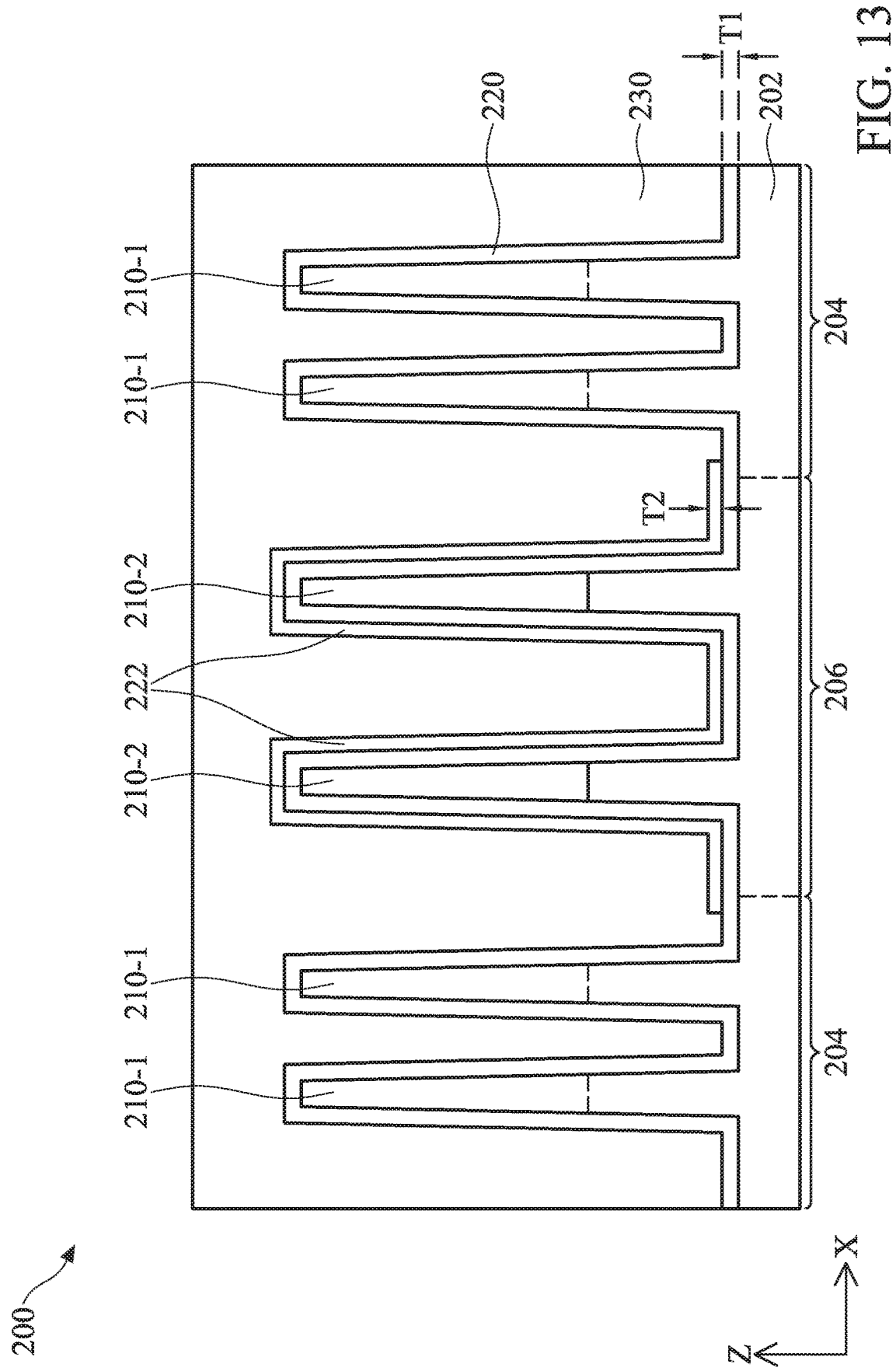
Figure 14:
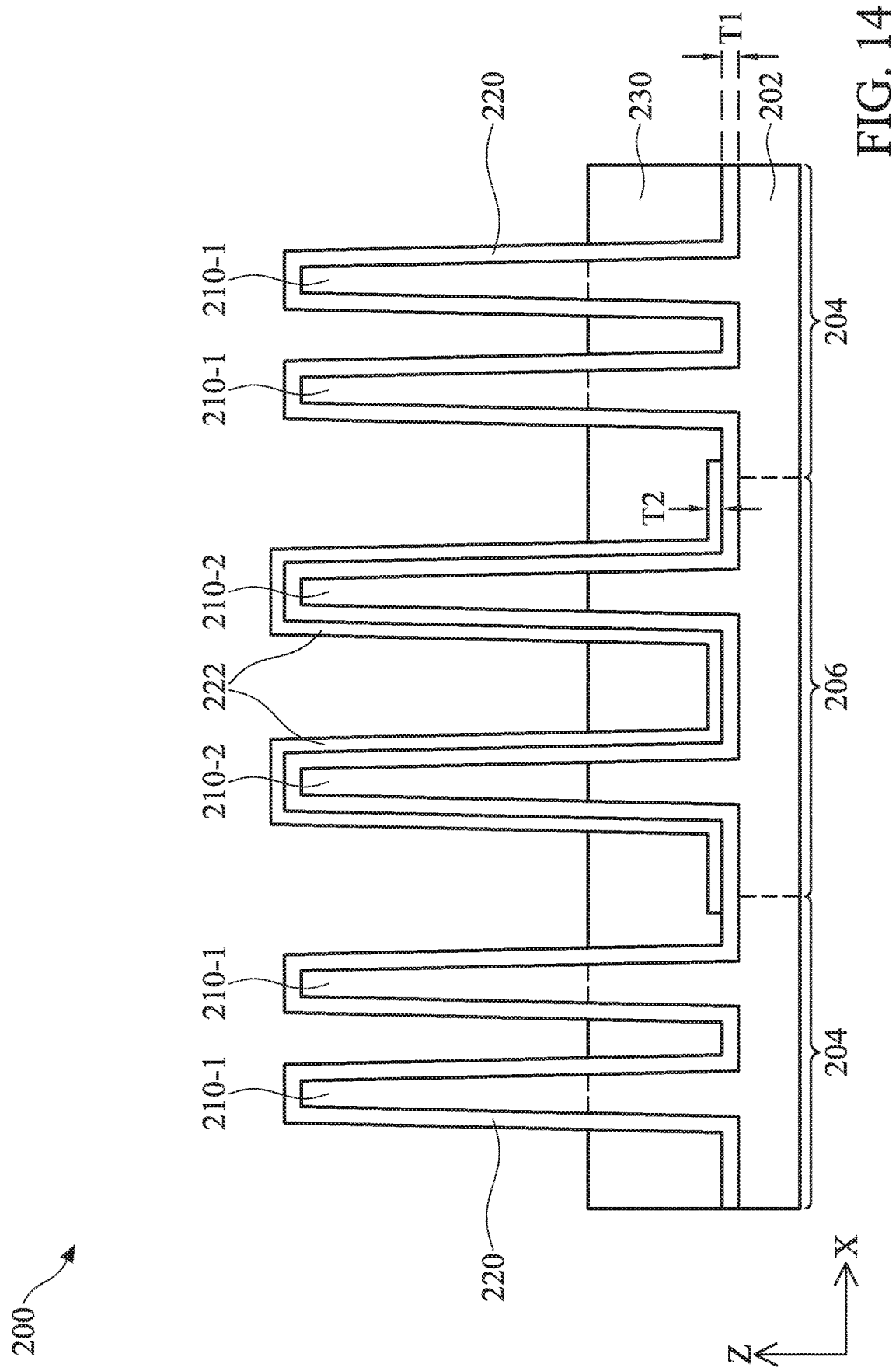
Figure 15:
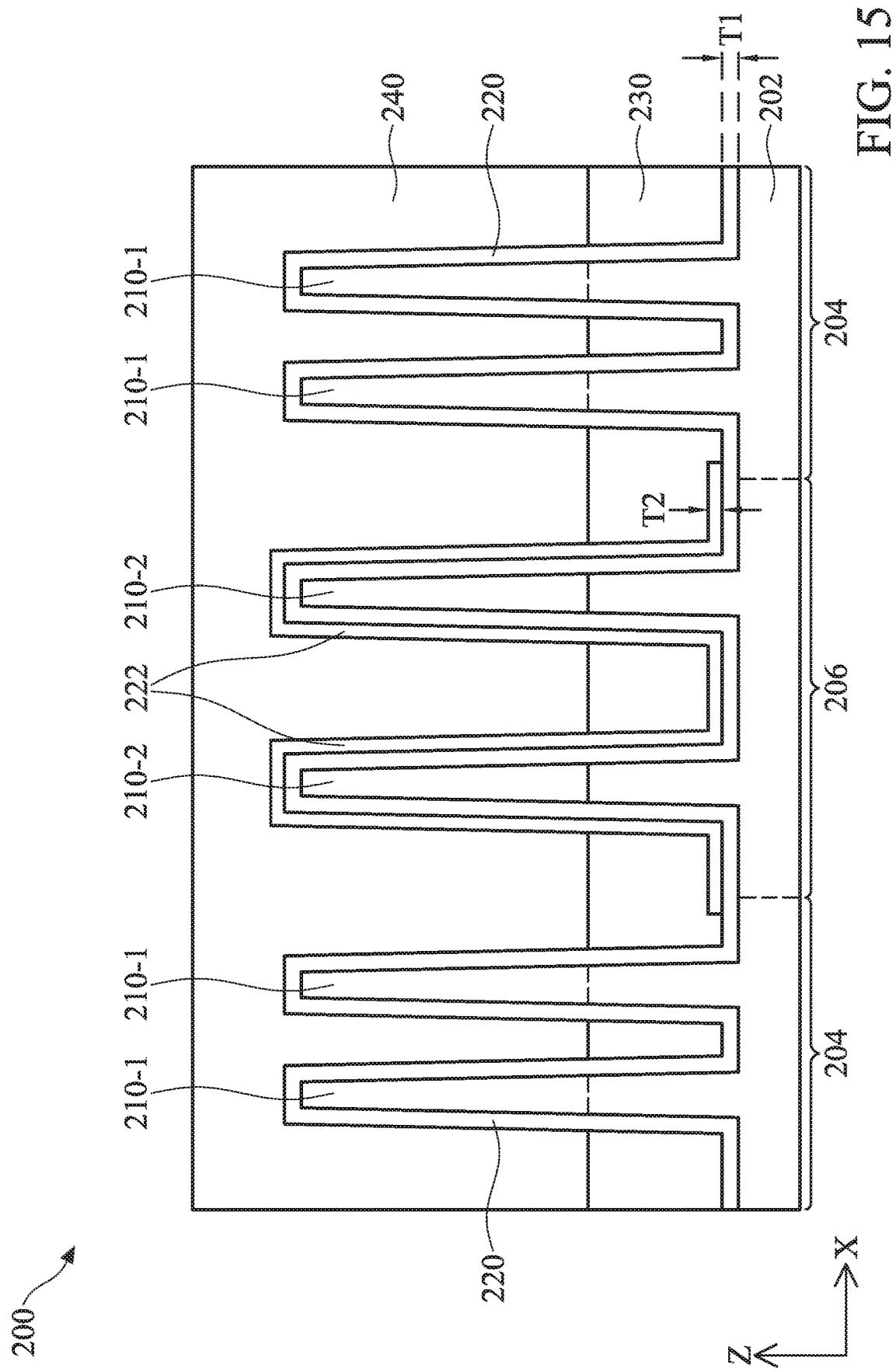

Now referring to FIGS. 1, 13 and 14, at operation 130, an isolation feature 230 is formed over substrate 202 to isolate various regions of the device 200. For example, the isolation feature 230 electrically isolates active device regions and/or passive device regions of the device 200. The isolation feature 230 further separates and isolates semiconductor fins 210 (including semiconductor fins 210-1 and 210-2) from one another. Isolation structure 204 includes an isolation material, such as silicon oxide, silicon nitride, silicon oxynitride, other suitable isolation material (for example, including silicon, oxygen, nitrogen, carbon, or other suitable isolation constituent), or combinations thereof. Isolation feature 22 can include different structures, such as shallow trench isolation (STI) structures, deep trench isolation (DTI) structures, and/or local oxidation of silicon (LOCOS) structures.

In some embodiments, referring to FIG. 13, the isolation feature 230 can be formed by filling the gaps (trenches) between the semiconductor fins 210-1 and 210-2 with insulator material, such as silicon oxide, by using a CVD, a PVD, a thermal oxidation process, or a spin-on glass process. Thereafter, referring to FIG. 14, the insulator material is etched back to form the isolation feature 230. The etching process may include dry etching process, wet etching process, other etching process, or combinations thereof. And, a chemical mechanical polishing (CMP) process may be performed to remove excessive insulator material and/or planarize a top surface of the isolation feature 230. As depicted in FIG. 14, in the NFET region 204, for the NFET, the isolation feature 230 is disposed on the first liner layer 220; and in the PFET region 206, for the PFET, the isolation feature 230 is disposed on the second liner layer 222, and further over the first liner layer 220. The isolation feature 230 isolates the lower portions 210-1L of the semiconductor fins 210-1 and the lower portions 210-2L of the semiconductor fins 210-2.

Here, take the example that the isolation feature 230 includes silicon oxide. During the formation of the isolation feature, the oxygen ions in the insulator material may cause the oxidation of the SiGe channel of the PFET. However, in the present disclosure, the SiGe channel of the PFET is protected by both a first liner layer including SiO2 and a second liner layer including Si3N4. The second liner layer including Si3N4 can block the oxygen ions in the insulator material from diffusing into and reacting with the SiGe channel of the PFET, thus can mitigate the channel oxygen issue of the PFET and improve the performance of the PFET.

Now referring to FIGS. 1 and 15-17, at operation 135, a metal gate structure 250 is formed over the substrate 202 (also referring to FIG. 2). The metal gate structure 250 is formed using a gate replacement process. For example, referring to FIG. 15, a dummy gate structure 240 is formed over the channel regions of the semiconductor fins 210, in particular, over the isolation feature 230, the first liner layer 220 in the NFET region 204 and the second liner layer 222 in the PFET region 206. In some embodiments, the dummy gate 240 may include a dummy gate electrode comprising polysilicon and various other layers, for example, a hard mask layer disposed over the dummy gate electrode, and an interfacial layer disposed over the semiconductor fins 210 and the isolation feature 230, and below dummy gate electrode. The dummy gate structure 240 serves as a placeholder for subsequently forming a metal gate structure 250.

Figure 16:
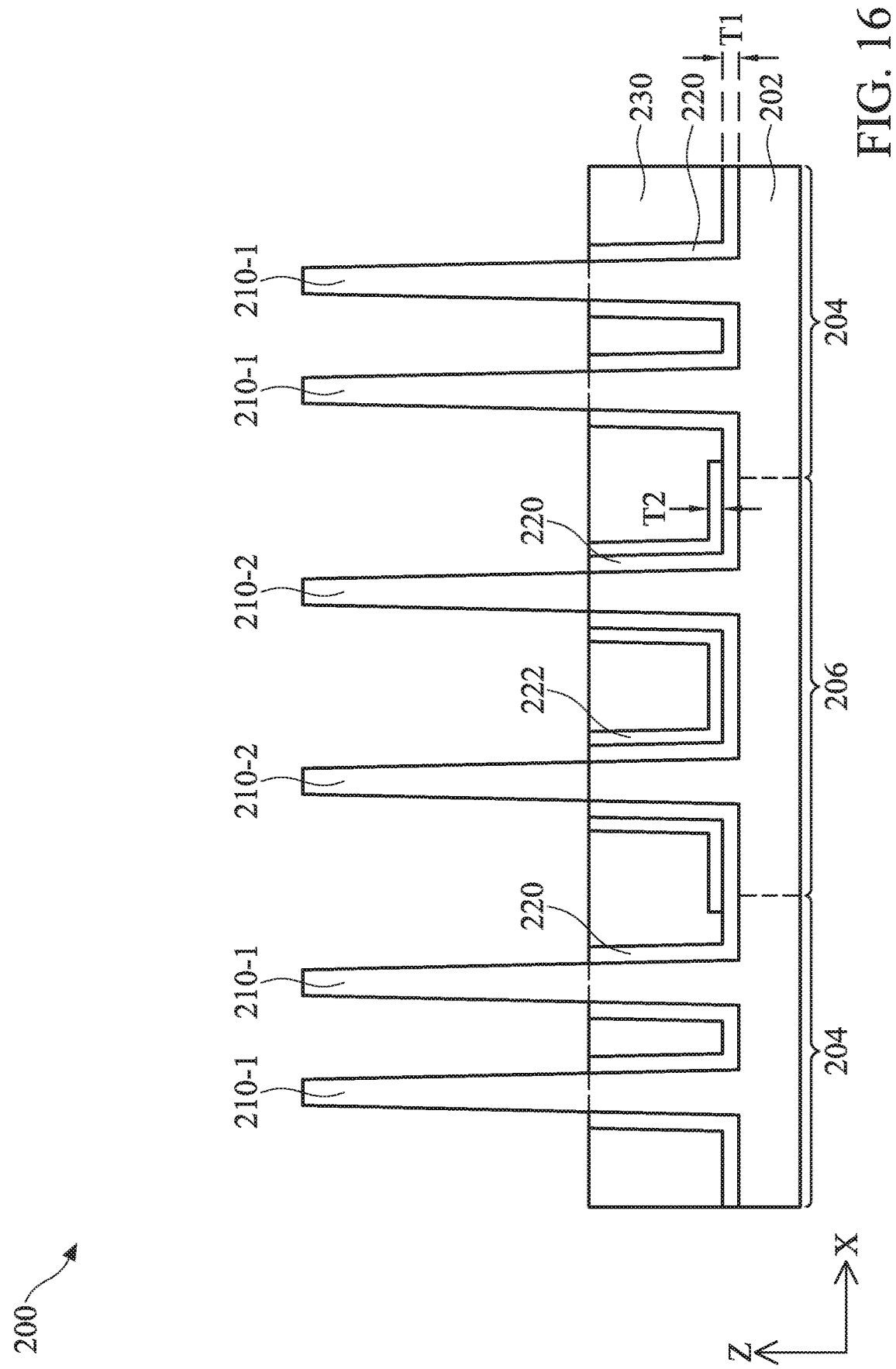

Referring to FIG. 16, after the formation of other structures (such as epitaxial S/D features and an interlayer dielectric (ILD) layer, not shown) of the device 200, the dummy gate structure is removed using one or more etching processes, therefore leaving an opening over the channel regions of the semiconductor fins 210 which expose the first liner layer 220 in the NFET region 204 and the second liner layer 222 in the PFET region 206. Subsequently, the portions of the second liner layer 222 over the isolation feature 230 (i.e. the portions of the second liner layer 222 wrapping the top portions 210-2U of the semiconductor fins 210-2) are selectively removed, for example, by an etching process. The etching process may include dry etching process, wet etching process, other etching process, or combinations thereof. In some further embodiments, the selective etching process is a selective dry etching process using phosphoric acid (H3PO4). Thereafter, the portions of the first liner layer 220 over the isolation feature 230 (i.e. the portions of the first liner layer 220 wrapping the top portions 210-1U of the semiconductor fins 210-1 and the top portions 210-2U of the semiconductor fins 210-2) are removed by an etching process, such as dry etching process, wet etching process, other etching process, or combinations thereof. Thereby, the top portions 210-1U of the semiconductor fins 210-1 and the top portions 210-2U of the semiconductor fins 210-2 are exposed as illustrated in FIG. 16. In some other embodiments, the portions of the second liner layer 222 and the portions of the first liner layer 220 over the isolation feature are removed after forming the isolation feature 230 and before forming the dummy gate structure 240.

Figure 17:
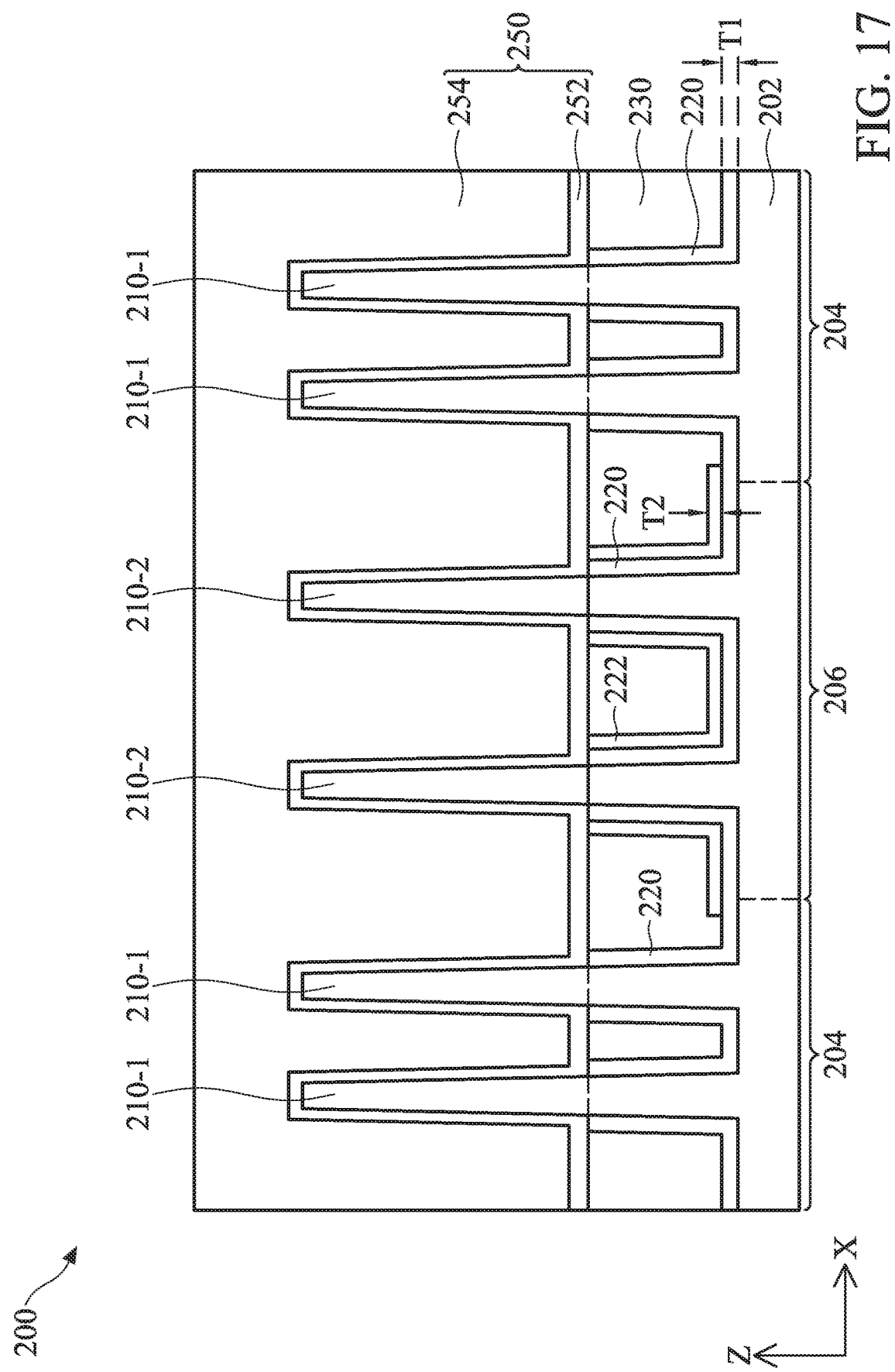

Referring to FIG. 17, a metal gate structure 250 is then formed over the channel regions of the semiconductor fins 210 in place of the dummy gate structure 240. In some embodiments, the metal gate structure 250 include a gate dielectric layer 252, disposed over the isolation feature 230, the semiconductor fins 210-1 in the NFET region 204 and the semiconductor fins 210-2 in the PFET region 206. The metal gate structure 250 also include a gate electrode 254 disposed over the gate dielectric layer 252. As depicted in FIG. 17, a bottom portion of the gate dielectric layer 252 directly contact a top surface of the isolation feature 230, a top surface of the first liner layer 220 in the NFET region 204, and the top surfaces of the first liner layer 220 and the second liner layer 222 in the PFET region 206. The side portions of the gate dielectric layer 252 wraps around the top portions of the semiconductor layer 210. In some embodiments, the gate dielectric layer 252 may include a high-k dielectric material. In some embodiments, the gate dielectric layer 252 may be a single-layer dielectric layer of a multilayer dielectric layer. In some embodiments, the gate electrode 254 may include a metal-containing material. In some embodiments, the gate electrode 254 may include a work function metal (WFM) and a bulk metal. The WFM is configured to tune a work function of its corresponding transistor to achieve a desired threshold voltage Vt. And, the bulk metal is configured to serve as the main conductive portion of the functional gate structure. In some embodiments, the metal gate structure 250 may include other layers, such as an interfacial layer, a barrier layer, a hard mask layer, etc. Formation of the metal gate structure 250 include various processes, such as ALD, CVD, PVD, and/or other suitable processes. A planarization (such as a CMP) process can be performed to remove any excess material of the metal gate structure and planarize the top surface of the metal gate structure 250.

Figure 18:
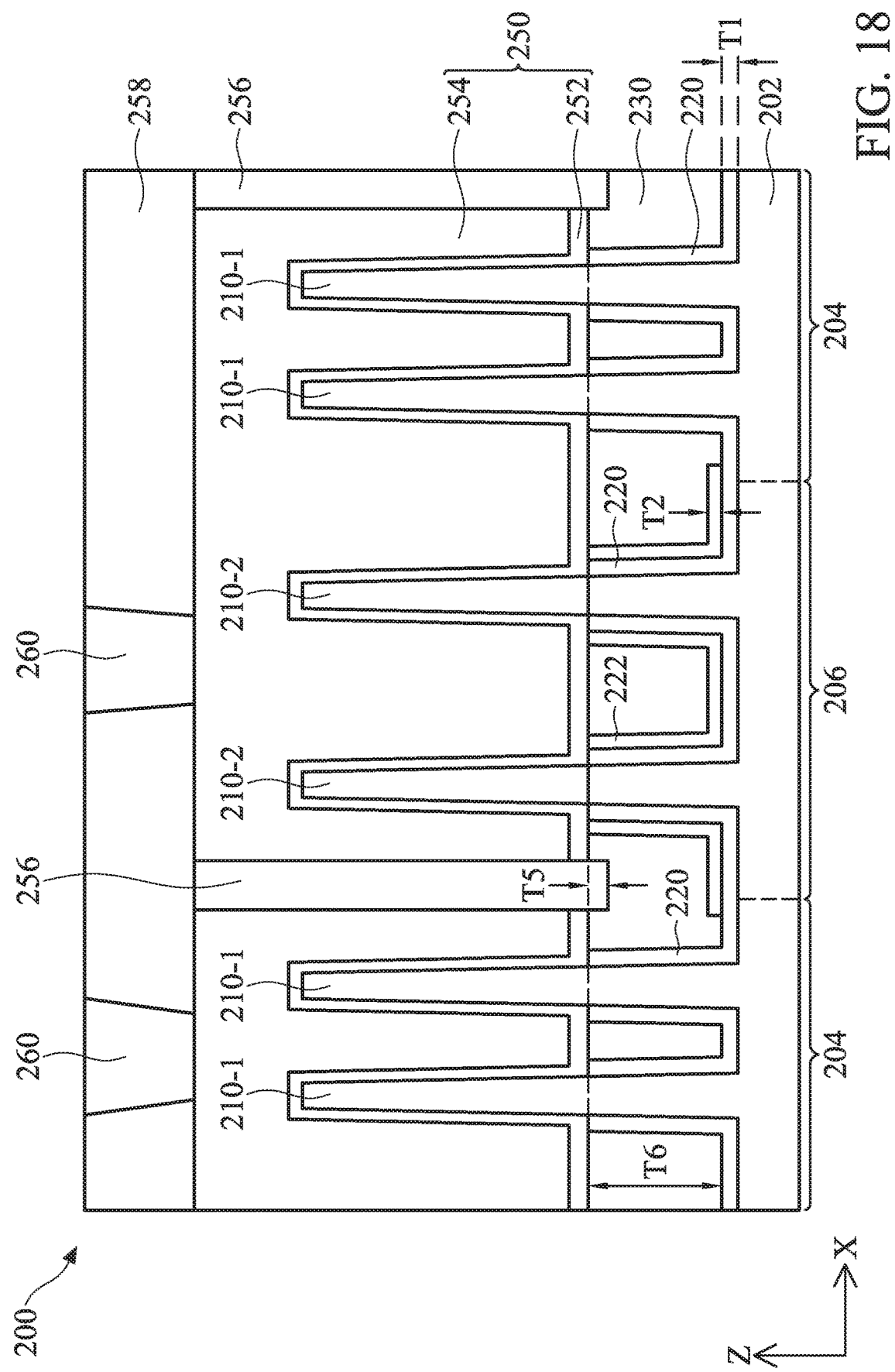

Referring to FIGS. 1 and 18, at operation 140, various other features may be formed to complete the fabrication. For example, separation features 256 may be formed within the metal gate structure 250. The positions of the separation features 256 are decided by the design requirement of the device 200 (for example, in the depicted embodiment, the device 200 is an SRAM). In some embodiments, the separation features 256 include a dielectric material (such as SiN, SiO, SiCN, SiOCN, SiOC, other dielectric material, or combinations thereof) and is formed by any suitable processes (for example, a patterning process, an etching process, and/or a deposition process). As depicted in FIG. 18, the separation feature 256 is inserted into the isolation feature 230 to ensure the complete separation in the gate structures 250 in different regions 204 and 206. In some embodiments, a thickness T6 (in the z-direction) of the isolation feature 230 is about 30 nm to about 120 nm. And, a depth T5 (in the z-direction) that the separation feature 256 inserted under a top surface of the isolation feature 230 is about 0 to about 150 nm. In case the insertion depth T5 is greater than the thickness T6 of the isolation feature 230, the separation feature 256 is further inserted into the substrate 202, and the separation feature 256 may contact the sidewalls of the first liner layer 220 and/or the second liner layer 222.

Still at operation 140, multilayer interconnect features (e.g., metal layers and interlayer dielectric layers such as ILD layer 258), and contacts/vias 260 are formed over the device 200, configured to connect the various features to form a functional circuit that may include one or more multi-gate devices.

Figure 19:
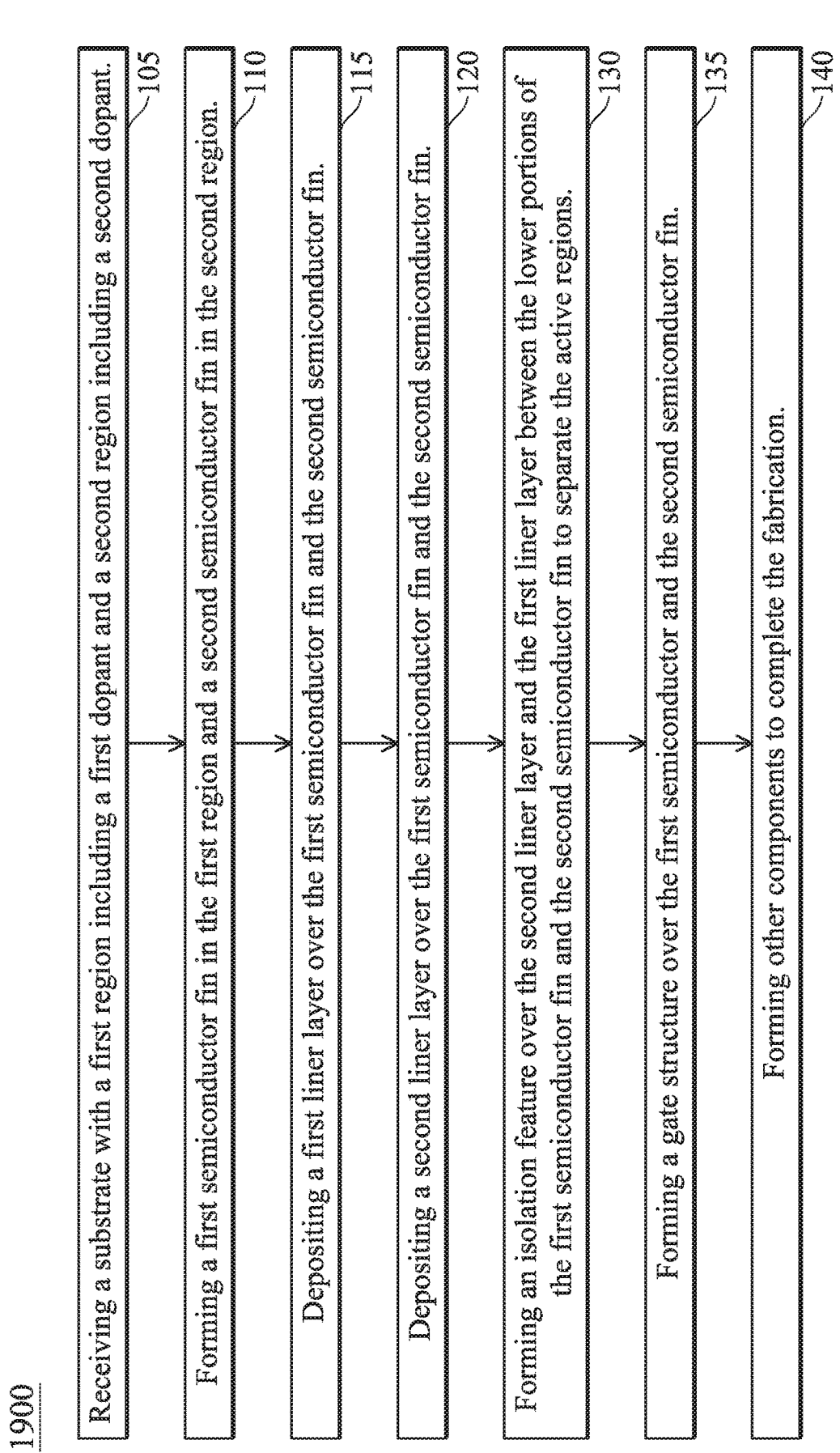
FIG. 19 illustrates a flowchart of another example method for making another example semiconductor device in accordance with some other embodiments of the present disclosure.

FIG. 19 illustrate another flow chart of a method 1900 for forming a semiconductor device 2000 (hereafter called device 2000) in accordance with some other embodiments of the present disclosure. Method 1900 is merely an example and is not intended to limit the present disclosure beyond what is explicitly recited in the claims. Additional operations can be performed before, during, and after method 1900, and some operations described can be replaced, eliminated, or moved around for additional embodiments of the method. Method 1900 is described below in conjunction with other figures, such as FIGS. 20-25, which illustrate various cross-sectional views of device 2000 during intermediate steps of method 1900. The steps of the method 1900 with the same reference number as the method 100 indicating the same operation. The features of the device 2000 with the same reference number as the features of device 200 indicating the same structure and material and the same fabrication methods, unless it is otherwise described below.

The method 1900 is similar as the method 100, except that the operation 125 is removed. As discussed above, at operation 125, portions of the second liner layer 222 formed on the first liner layer 220 and over the semiconductor fins 210-1 (within the NFET region 204) are removed. However, to simplify the fabrication, here in the method 1900, the second liner layer 222 formed over the semiconductor fins 210-1 remain unchanged. Therefore, referring to FIG. 20, the second liner layer 222 is formed over the first liner layer 220 within both the NFET region 204 and the PFET region 206. Due to the small pitch distance D1 between the semiconductor fins 210-1 and the small pitch distance D2 between the semiconductor find 210-2, the thickness T3 of the first liner layer 220 and the thickness T4 of the second liner layer 222 of the device 2000 are constraint. In some embodiments, the thickness T3 is about 1 nm to about 2 nm and the thickness T4 is about 1 nm to about 2 nm. And, a sum of the thickness T3 and the thickness T4 is about 2 nm to about 4 nm. The thickness of the first liner layer 220 and the second liner layer 222 of device 2000 are thinner than those of device 200, such that each of the first liner layer 220 and the second liner layer 222 is functional (for example, the first liner layer can block the electric charges that deactivating the dopant of the NFET, and the second liner layer can mitigate the oxidation issue of the SiGe channels of the PFET), and the total thickness of the first and second liner layers are not too thick to occupy too much space between the semiconductor fins.

Figure 20:
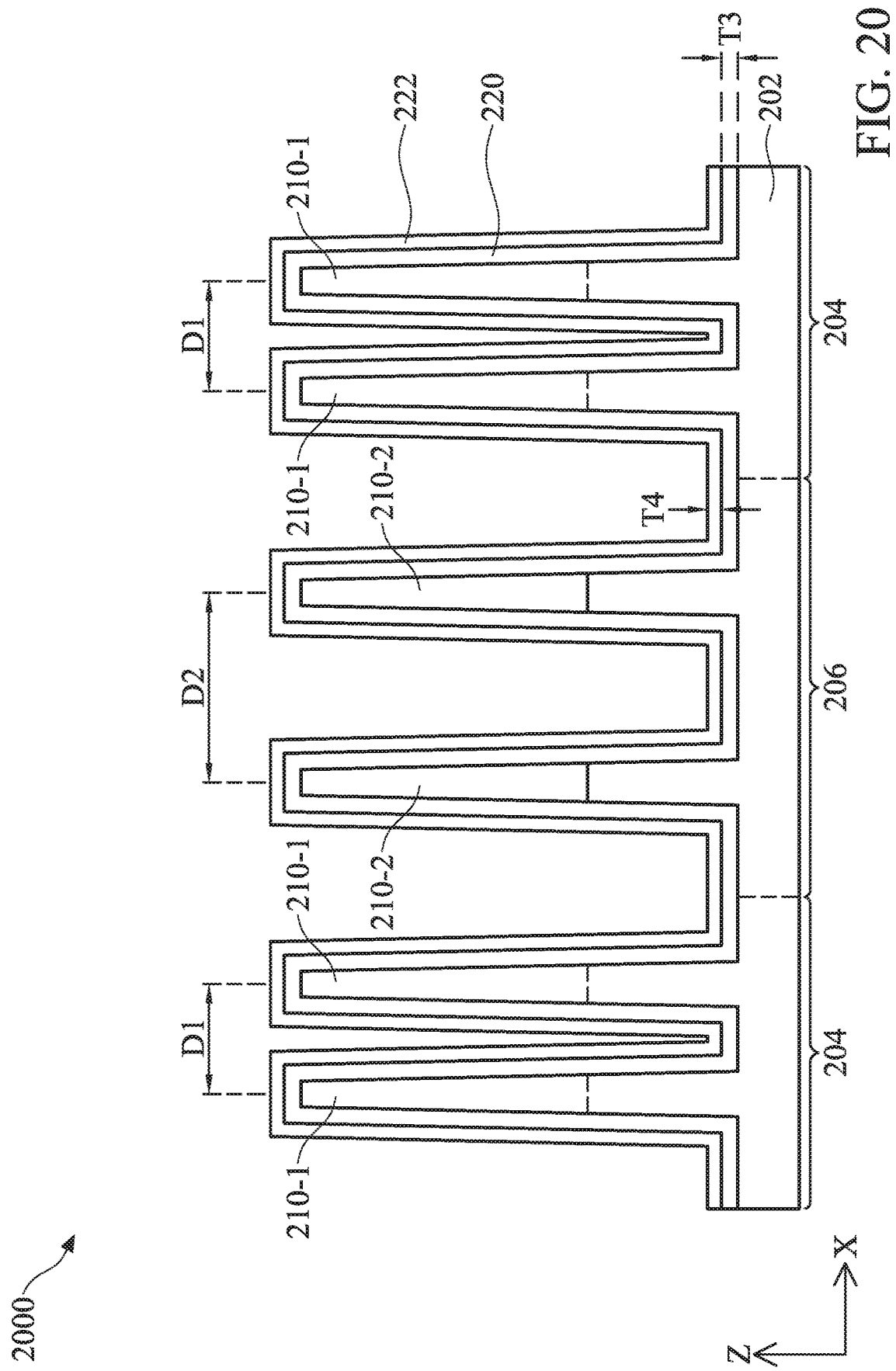
FIGS. 20-25 illustrate cross-sectional views of the other example semiconductor device at intermediate stages of the other example method of FIG. 19 in accordance with some other embodiments of the present disclosure.

As depicted in FIG. 20, the second liner layer 222 is disposed over the first liner layer 220 for both the NFET and the PFET of the device 2000. The thickness T3 of the first liner layer 220 of the device 2000 is thinner than that of the device 200, thus the dopant (for example [B]) of the NFET may still be slightly affected (i.e. deactivated) by the electric charges of the second liner layer 222. To mitigate this issue, the doping concentration of the NFET channel and/or the NFET region (p-type doped region) 204 may be greater than the doping concentration of the PFET channel and/or the PFET region (n-type doped region) 206 when forming the doped regions of the substrate 202 and/or the semiconductor fins 210. For example, a doping concentration of the NFET fins and/or the NFET region 204 is about 1.2 to about 1.5 times of a doping concentration of the PFET fins and/or the PFET region 206.

Figure 21:
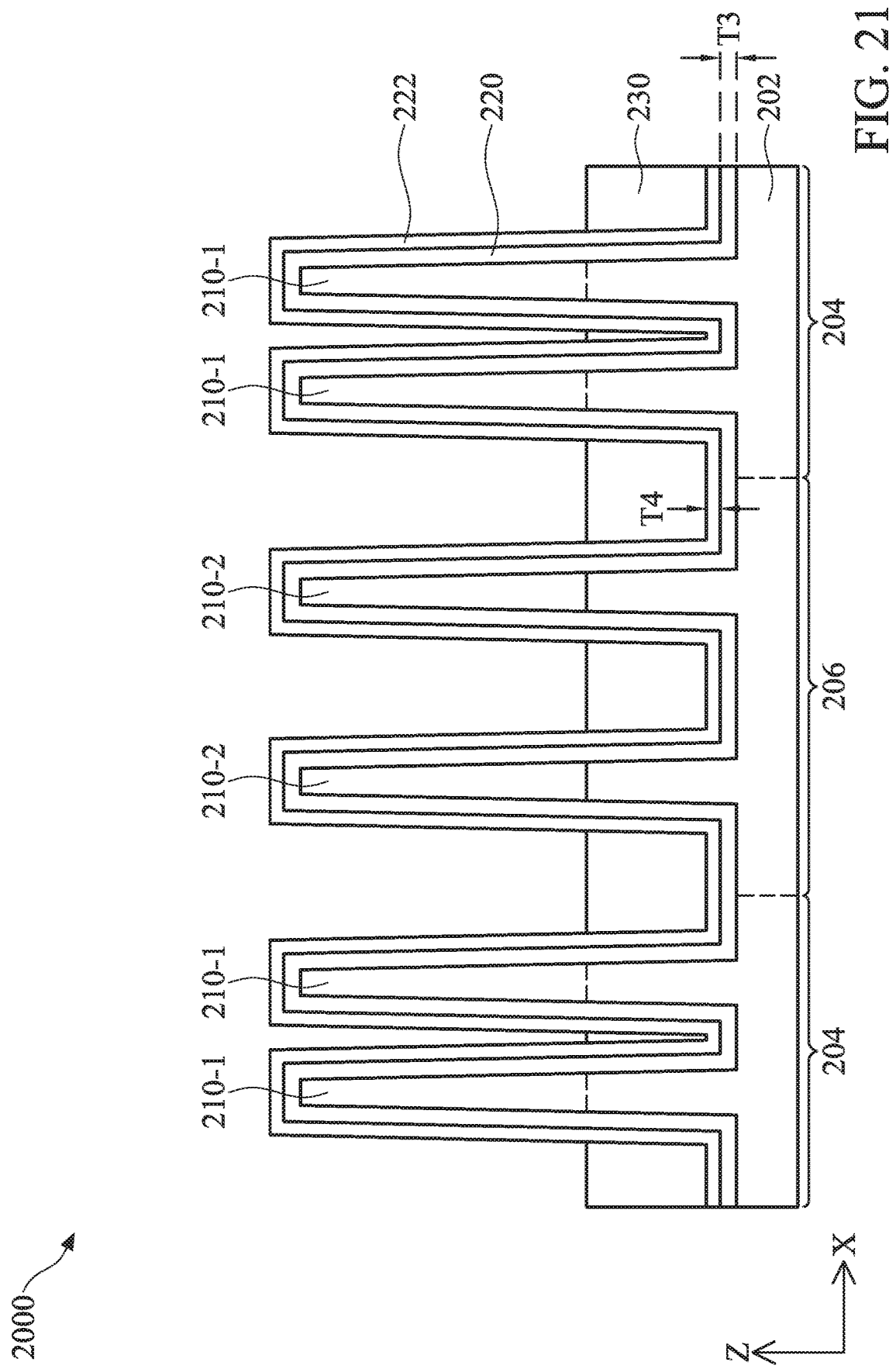

Referring to FIG. 21, regarding the device 2000, the isolation feature 230 is formed over the second liner layer 222 within both the NFET region 204 and the PFET region 206.

Figure 22:
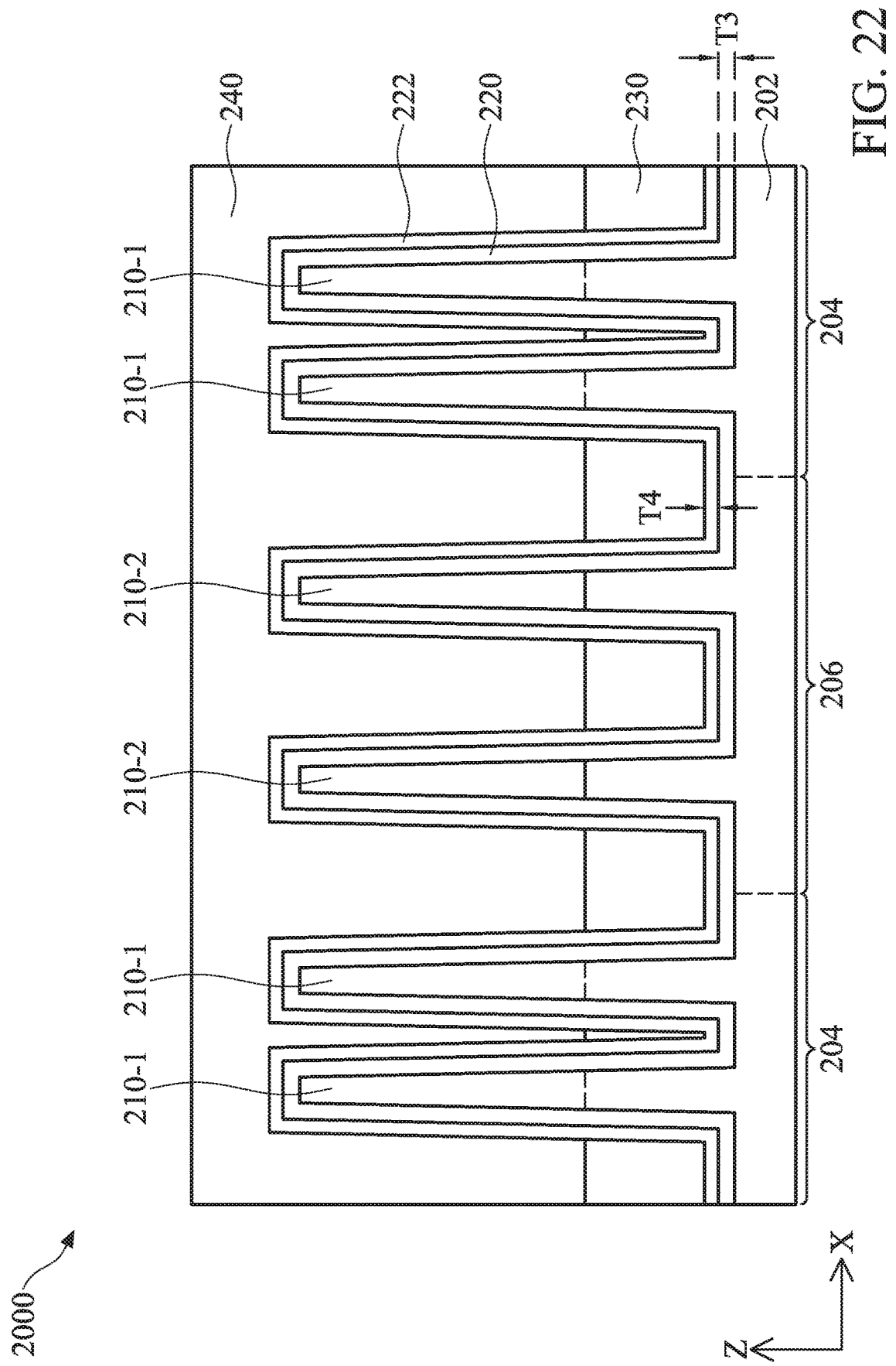
Figure 23:
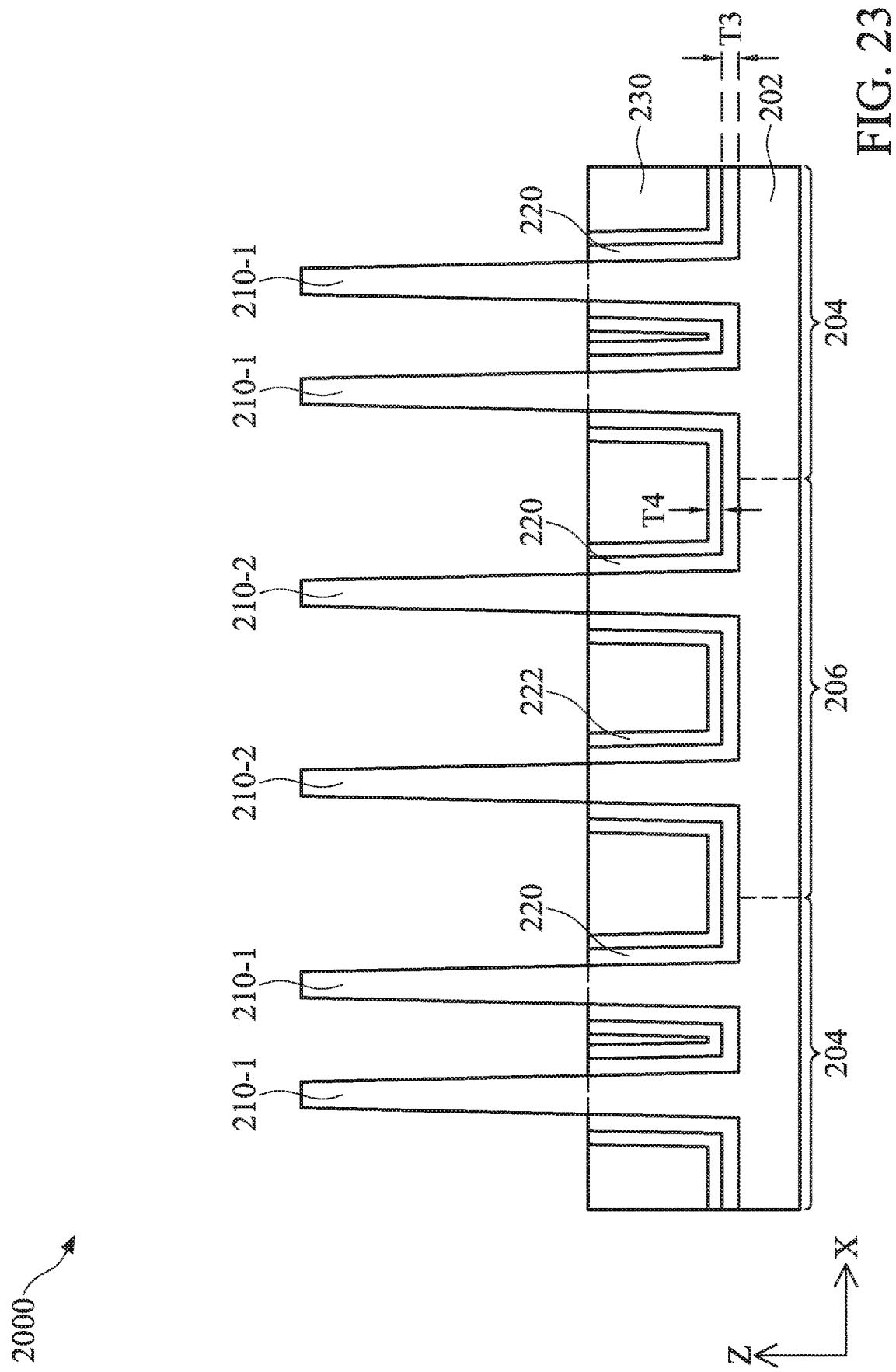
Figure 24:
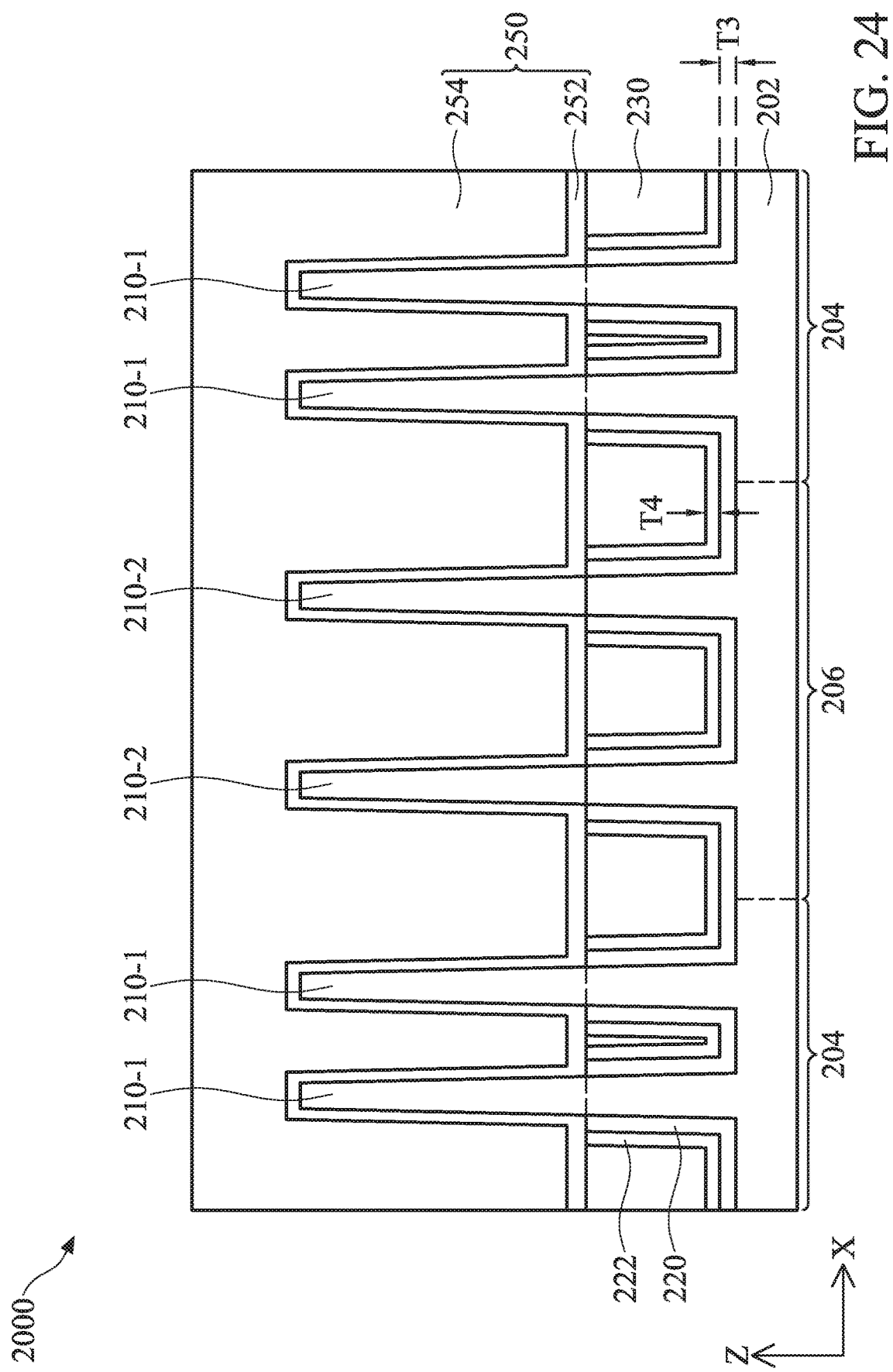

Referring to FIGS. 22-24, the metal gate structure 250 is formed over the channel regions of the semiconductor fins 210. For example, referring to FIG. 22, a dummy gate structure 240 is formed over the isolation feature 230 and the second liner layer 222 in the NFET region 204 and the PFET region 206. Referring to FIG. 23, after the formation of the epitaxial S/D features and the ILD layer (not shown), the dummy gate structure 240 is removed. Thereafter, the portions of the second liner layer 222 and the first liner layer 220 wrapping around the top portions of the semiconductor fins 210 are subsequently removed. Thereby, the top portions of semiconductor fins 210 are exposed. Then, referring to FIG. 24, the metal gate structure 250 including the gage dielectric layer 252 and the gate electrode 254 are formed to engage the channel regions of the semiconductor fins 210. In the depicted embodiment of the device 2000, the bottom portion of the gate dielectric layer 252 contacts a top surface of the isolation feature 230, top surfaces of the first liner layer 220 and the second liner layer 222 in the NFET region 204 and the PFET region 206.

Figure 25:
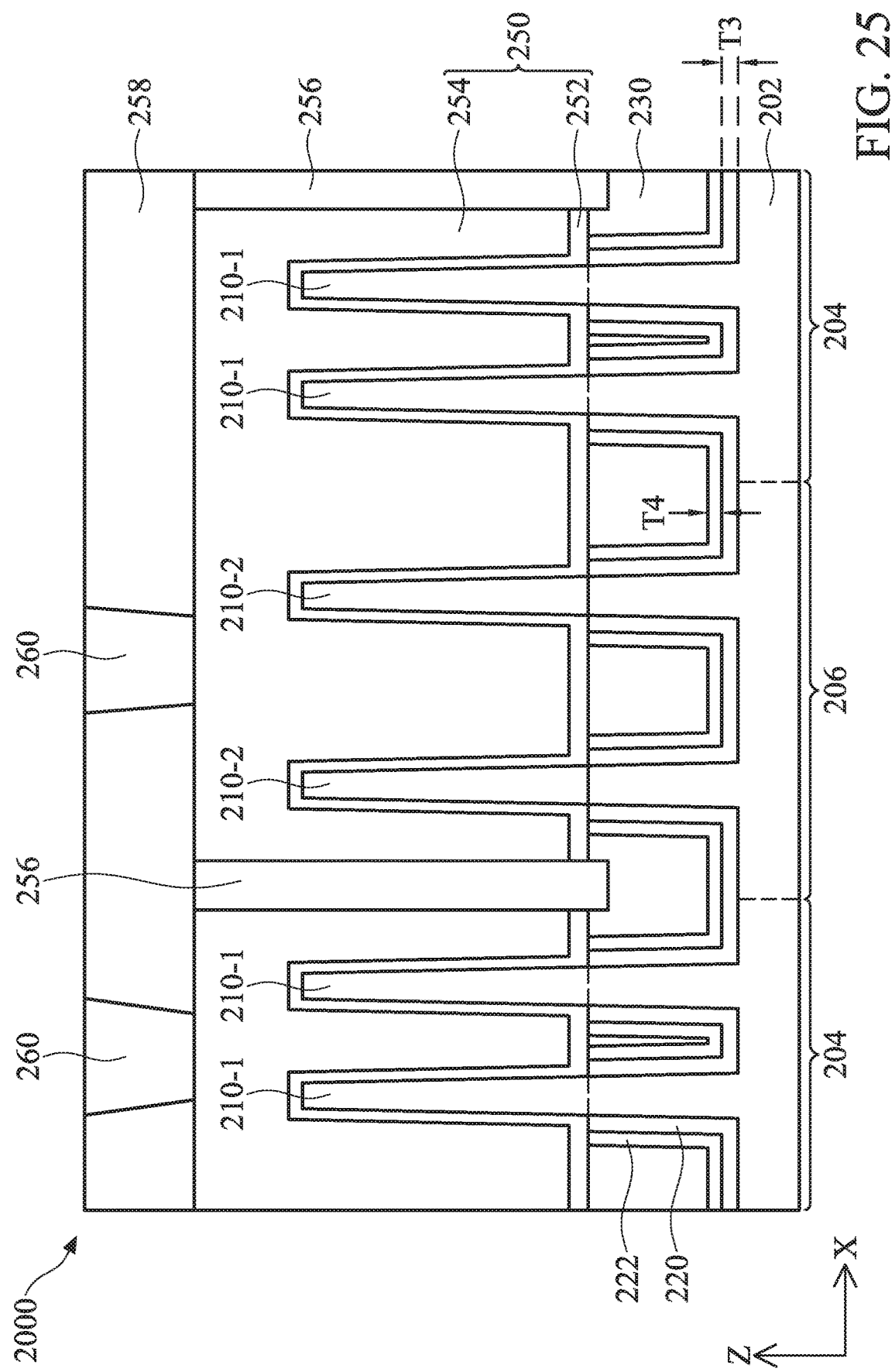

Referring to FIG. 25, various other features may be formed to complete the fabrication. For example, separation features 256 may be formed within the metal gate structure 250 according to the design requirements of the device 2000. Multilayer interconnect features (e.g., metal layers and interlayer dielectric layers such as ILD layer 258), and contacts/vias 260 are formed over the device 200, configured to connect the various features to form a functional circuit that may include one or more multi-gate devices.

Although not intended to be limiting, one or more embodiments of the present disclosure provide many benefits to a semiconductor device and a formation process thereof. For example, embodiments of the present disclosure provide a semiconductor device with a first liner layer and a second liner layer formed between the semiconductor fins and the isolation feature (for example, an STI feature). The first liner layer (for example, including SiO2) can block the electric charges of the second liner layer which may deactivate the dopant (for example, [B]) in the NFET region, and the second liner layer (for example, including Si3N4) can protect the PFET SiGe channels from being oxidized by the isolation feature. In some embodiments, the second liner layer within the NFET region is removed, such that the dopant deactivation issue of the NFET region can be reduced. Therefore, the performance of the PFET and the NFET of the semiconductor device can both be improved. The fabrication process can be integrated in the current process flow and can be applied to multiple technology generations.

The present disclosure provides for many different embodiments. Semiconductor device having air gaps formed in the metal gates and methods of fabrication thereof are disclosed herein. An exemplary semiconductor device comprises a substrate having a first region and a second region; a first semiconductor fin formed on the substrate within the first region; a second semiconductor fin formed on the substrate within the second region; a first liner layer disposed along a lower portion of the first semiconductor fin and a lower portion of the second semiconductor fin; a second liner layer disposed over the first liner layer in the second region, wherein the second liner layer is different from the first liner layer in composition; and an isolation feature disposed on the first liner layer in the first region and on the second liner layer in the second region, and separating lower portions of the first semiconductor fin and the second semiconductor fin.

In some embodiments, the first semiconductor fin is doped with a p-type dopant to form a channel for an n-type field effect transistor (FET) and the second semiconductor fin is doped with an n-type dopant to form a channel for a p-type FET. In some embodiments, the first liner layer includes a first dielectric material effective to block the p-type dopant from being deactivated in the first semiconductor fin; and the second liner layer includes a second dielectric material effective to prevent oxygen from diffusing into the second semiconductor fin. In some embodiments, the first liner layer includes silicon dioxide (SiO2) and the second layer includes silicon nitride (Si3N4). In some embodiments, the first liner layer has a uniform thickness on the first semiconductor fin and the second semiconductor fin; and the second liner layer has a uniform thickness on the first liner layer in the second region. In some embodiments, a thickness of the first liner layer is about 2 nm to about 4 nm and a thickness of the second liner layer is about 1 nm to about 3 nm.

In some embodiments, the semiconductor device further comprises a metal gate structure including a gate dielectric layer and a gate electrode, wherein the gate dielectric layer is formed on a top surface of the isolation feature, a top surface of the first liner layer in the first region, and a top surface of the second liner layers in the second region, and the gate electrode is formed over the gate dielectric layer.

In some embodiments, the semiconductor device further comprises a dielectric separation feature disposed in the metal gate structure between the first region and the second region, wherein the dielectric separation feature is inserted into the isolation feature.

In some embodiments, the separation feature is further inserted into the substrate and contact sidewalls of the first liner layer and the second liner layer. In some embodiments, the second liner layer is shifted over a portion of the first liner layer in the first region, and a shifting distance of the second liner layer over the portion of the first liner layer in the first region is less than about 30% of a distance between the first semiconductor fin and the second semiconductor fin.

An exemplary method includes forming a first semiconductor fin within a first region and a second semiconductor fin within a second region over a substrate, wherein the first semiconductor fin includes a first type dopant and the second semiconductor fin includes a second type dopant; depositing a first liner layer over the first semiconductor fin and the second semiconductor fin; and depositing a second liner layer over the first liner layer; removing the second liner layer in the first region to expose the first liner layer in the first region; and forming an isolation feature directly on the first liner layer in the first region and directly on the second liner layer in the second region to isolate lower regions of the first semiconductor fin and the second semiconductor fin.

In some embodiments, the first semiconductor fin includes the first type dopant of a first doping concentration, the second semiconductor fin includes the second type dopant of a second doping concentration, and the first doping concentration and the second doping concentration are substantially the same.

In some embodiments, depositing the first liner layer includes conformally depositing the first liner layer by atomic layer deposition (ALD); and depositing the second liner layer includes conformally depositing the second liner layer by ALD.

In some embodiments, depositing of the first liner layer includes depositing a first dielectric layer including a first dielectric material effective to block the p-type dopant from being deactivated in the first semiconductor fin; and depositing of the second liner layer includes depositing a second dielectric layer including a second dielectric material effective to prevent oxygen from diffusing into the second semiconductor fin.

In some embodiments, removing the second liner layer in the first region includes depositing a hard mask over the second region; selectively etching the second liner layer in the first region while the second region is covered by the hard mask; and removing the hard mask over the second region.

In some embodiments, the method further comprises performing an annealing process to the first liner layer before depositing the second liner layer.

In some embodiments, the method further comprises removing portions of the first liner layer and the second liner layer above the isolation feature; and forming a metal gate structure over the isolation feature, a top surface of the first liner layer in the first region, and a top surface of the second liner layer in the second region, wherein the metal gate structure wraps around channels of the first semiconductor fin and the second semiconductor fin.

In some embodiments, the method further comprises forming a dummy gate structure over the isolation feature, the first liner layer in the first region, and the second liner layer in the second region; forming epitaxial source/drain features in the first region and in the second region; and removing the dummy gate structure to expose the first liner layer in the first region and the second liner layer in the second region.

Another example semiconductor device comprises a substrate having a first region and a second region; a first semiconductor fin formed on the substrate within the first region; a second semiconductor fin formed on the substrate within the second region; a first liner layer disposed directly on the substrate and along sidewalls of a lower portion of the first semiconductor fin in the first region; a second liner layer disposed on the substrate and along sidewalls of a lower portion of the second semiconductor fin in the second region; and an isolation feature directly disposed on the first liner layer in the first region and on the second liner layer in the second region.

In some embodiments, the semiconductor device further comprises a first metal gate structure disposed over a top portion of the first semiconductor fin, wherein the first metal gate structure includes a first gate dielectric layer and a first gate electrode disposed over the first gate dielectric layer, a bottom portion of the first gate dielectric layer directly contacts a top surface of the first liner layer in the first region; and a second metal gate structure disposed over a top portion of the second semiconductor fin, wherein the second metal gate structure includes a second gate dielectric layer and a second gate electrode disposed over the second gate dielectric layer, a bottom portion of the second gate dielectric layer directly contacts a top surface of the second liner layer in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a substrate having a first region and a second region;
    a first semiconductor fin formed on the substrate within the first region;
    a second semiconductor fin formed on the substrate within the second region;
    a first liner layer disposed along a lower portion of the first semiconductor fin and a lower portion of the second semiconductor fin;
    a second liner layer disposed over the first liner layer in the second region, wherein the second liner layer is different from the first liner layer in composition; and
    an isolation feature disposed directly on the first liner layer in the first region and on the second liner layer in the second region, and separating lower portions of the first semiconductor fin and the second semiconductor fin.

2. The semiconductor device according to claim 1, wherein the first semiconductor fin is doped with a p-type dopant to form a channel for an n-type field effect transistor (FET) and the second semiconductor fin is doped with an n-type dopant to form a channel for a p-type FET.

3. The semiconductor device according to claim 2, wherein
    the first liner layer includes a first dielectric material effective to block the p-type dopant from being deactivated in the first semiconductor fin; and
    the second liner layer includes a second dielectric material effective to prevent oxygen from diffusing into the second semiconductor fin.

4. The semiconductor device according to claim 3, wherein the first liner layer includes silicon dioxide and the second layer includes silicon nitride.

5. The semiconductor device of claim 1, wherein the first liner layer has a uniform thickness on the first semiconductor fin and the second semiconductor fin; and the second liner layer has a uniform thickness on the first liner layer in the second region.

6. The semiconductor device of claim 1, wherein a thickness of the first liner layer is about 2 nm to about 4 nm and a thickness of the second liner layer is about 1 nm to about 3 nm.

7. The semiconductor device of claim 1, further comprising a metal gate structure including a gate dielectric layer and a gate electrode, wherein the gate dielectric layer is formed on a top surface of the isolation feature, a top surface of the first liner layer in the first region, and a top surface of the second liner layers in the second region, and the gate electrode is formed over the gate dielectric layer.

8. The semiconductor device of claim 7, further comprising a dielectric separation feature disposed in the metal gate structure between the first region and the second region, wherein the dielectric separation feature is inserted into the isolation feature.

9. The semiconductor device of claim 8, wherein the separation feature is further inserted into the substrate and contact sidewalls of the first liner layer and the second liner layer.

10. The semiconductor device of claim 1, wherein the second liner layer is shifted over a portion of the first liner layer in the first region, and a shifting distance of the second liner layer over the portion of the first liner layer in the first region is less than about 30% of a distance between the first semiconductor fin and the second semiconductor fin.

11. A method of forming a semiconductor device, comprising:
    forming a first semiconductor fin within a first region and a second semiconductor fin within a second region over a substrate, wherein the first semiconductor fin includes a first type dopant and the second semiconductor fin includes a second type dopant;
    depositing a first liner layer over the first semiconductor fin and the second semiconductor fin;
    depositing a second liner layer over the first liner layer;
    removing the second liner layer in the first region to expose the first liner layer in the first region; and
    forming an isolation feature directly on the first liner layer in the first region and directly on the second liner layer in the second region to isolate lower regions of the first semiconductor fin and the second semiconductor fin.

12. The method according to claim 11, wherein the first semiconductor fin includes the first type dopant of a first doping concentration, the second semiconductor fin includes the second type dopant of a second doping concentration, and the first doping concentration and the second doping concentration are substantially the same.

13. The method according to claim 11, wherein,
    depositing the first liner layer includes conformally depositing the first liner layer by atomic layer deposition (ALD); and
    depositing the second liner layer includes conformally depositing the second liner layer by ALD.

14. The method according to claim 11, wherein,
    depositing of the first liner layer includes depositing a first dielectric layer including a first dielectric material effective to block the p-type dopant from being deactivated in the first semiconductor fin; and
    depositing of the second liner layer includes depositing a second dielectric layer including a second dielectric material effective to prevent oxygen from diffusing into the second semiconductor fin.

15. The method according to claim 11, wherein removing the second liner layer in the first region includes:
    depositing a hard mask over the second region;
    selectively etching the second liner layer in the first region while the second region is covered by the hard mask; and
    removing the hard mask over the second region.

16. The method according to claim 11, further comprising:
    performing an annealing process to the first liner layer before depositing the second liner layer.

17. The method according to claim 11, further comprising:
    removing portions of the first liner layer and the second liner layer above the isolation feature; and forming a metal gate structure over the isolation feature, a top surface of the first liner layer in the first region, and a top surface of the second liner layer in the second region, wherein the metal gate structure wraps around channels of the first semiconductor fin and the second semiconductor fin.

18. The method according to claim 17, further comprising:
forming a dummy gate structure over the isolation feature, the first liner layer in the first region, and the second liner layer in the second region;
forming epitaxial source/drain features in the first region and in the second region; and
removing the dummy gate structure to expose the first liner layer in the first region and the second liner layer in the second region.

19. A semiconductor device comprising:
a substrate having a first region and a second region;
a first semiconductor fin formed on the substrate within the first region;
a second semiconductor fin formed on the substrate within the second region;
a first liner layer disposed directly on the substrate and along sidewalls of a lower portion of the first semiconductor fin in the first region;
a second liner layer disposed on the substrate and along sidewalls of a lower portion of the second semiconductor fin in the second region; and
an isolation feature directly disposed on the first liner layer in the first region and on the second liner layer in the second region.

20. The semiconductor device of claim 19, further comprising:
a first metal gate structure disposed over a top portion of the first semiconductor fin, wherein the first metal gate structure includes a first gate dielectric layer and a first gate electrode disposed over the first gate dielectric layer, a bottom portion of the first gate dielectric layer directly contacts a top surface of the first liner layer in the first region; and
a second metal gate structure disposed over a top portion of the second semiconductor fin, wherein the second metal gate structure includes a second gate dielectric layer and a second gate electrode disposed over the second gate dielectric layer, a bottom portion of the second gate dielectric layer directly contacts a top surface of the second liner layer in the second region.

* * * * *